(12) United States Patent
Sipani et al.

(10) Patent No.: US 8,530,352 B2
(45) Date of Patent: Sep. 10, 2013

(54) METHODS OF PATTERNING A MATERIAL

(71) Applicant: Micron Technology, Inc., Boise, ID (US)

(72) Inventors: Vishal Sipani, Boise, ID (US); Baosuo Zhou, Boise, ID (US); Ming-Chuan Yang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/769,473

(22) Filed: Feb. 18, 2013

(65) Prior Publication Data

US 2013/0164944 A1   Jun. 27, 2013

Related U.S. Application Data

(62) Division of application No. 13/491,466, filed on Jun. 7, 2012, now Pat. No. 8,389,407, which is a division of application No. 12/860,765, filed on Aug. 20, 2010, now Pat. No. 8,216,939.

(51) Int. Cl.
   *H01L 21/44* (2006.01)

(52) U.S. Cl.
   USPC .................. 438/675; 438/669; 438/671

(58) Field of Classification Search
   USPC .................. 438/669, 671, 672, 675
   See application file for complete search history.

(56) References Cited

U.S. PATENT DOCUMENTS

| | | | |
|---|---|---|---|
| 5,328,810 A | 7/1994 | Lowrey et al. | |
| 6,187,211 B1 | 2/2001 | Smith et al. | |
| 6,696,222 B2 * | 2/2004 | Hsue et al. | 430/313 |
| 6,893,954 B2 | 5/2005 | Maekawa | |
| 7,115,525 B2 | 10/2006 | Abatchev et al. | |
| 7,122,425 B2 * | 10/2006 | Chance et al. | 438/253 |
| 7,253,118 B2 | 8/2007 | Tran et al. | |
| 7,553,690 B2 | 6/2009 | Francis et al. | |
| 7,902,066 B2 | 3/2011 | Ye et al. | |
| 7,964,499 B2 | 6/2011 | Kim et al. | |
| 2006/0216653 A1 | 9/2006 | Paxton et al. | |
| 2007/0049035 A1 | 3/2007 | Tran | |
| 2007/0105268 A1 | 5/2007 | Cuozzo et al. | |
| 2007/0181929 A1 | 8/2007 | Juengling | |
| 2007/0212648 A1 | 9/2007 | Lalbahadoersing et al. | |
| 2007/0281470 A1 * | 12/2007 | Takasaki | 438/637 |
| 2008/0286934 A1 | 11/2008 | Cho et al. | |
| 2009/0032963 A1 | 2/2009 | Tran | |
| 2009/0115064 A1 | 5/2009 | Sandhu et al. | |
| 2010/0283155 A1 * | 11/2010 | Tang et al. | 257/773 |

* cited by examiner

*Primary Examiner* — Phuc Dang
(74) *Attorney, Agent, or Firm* — Wells St. John P. S.

(57) ABSTRACT

Some embodiments include methods of forming openings. For instance, a construction may have a material over a plurality of electrically conductive lines. A plurality of annular features may be formed over the material, with the annular features crossing the lines. A patterned mask may be formed over the annular features, with the patterned mask leaving segments of the annular features exposed through a window in the patterned mask. The exposed segments of the annular features may define a plurality of openings, and such openings may be transferred into the material to form openings extending to the electrically conductive lines.

7 Claims, 24 Drawing Sheets

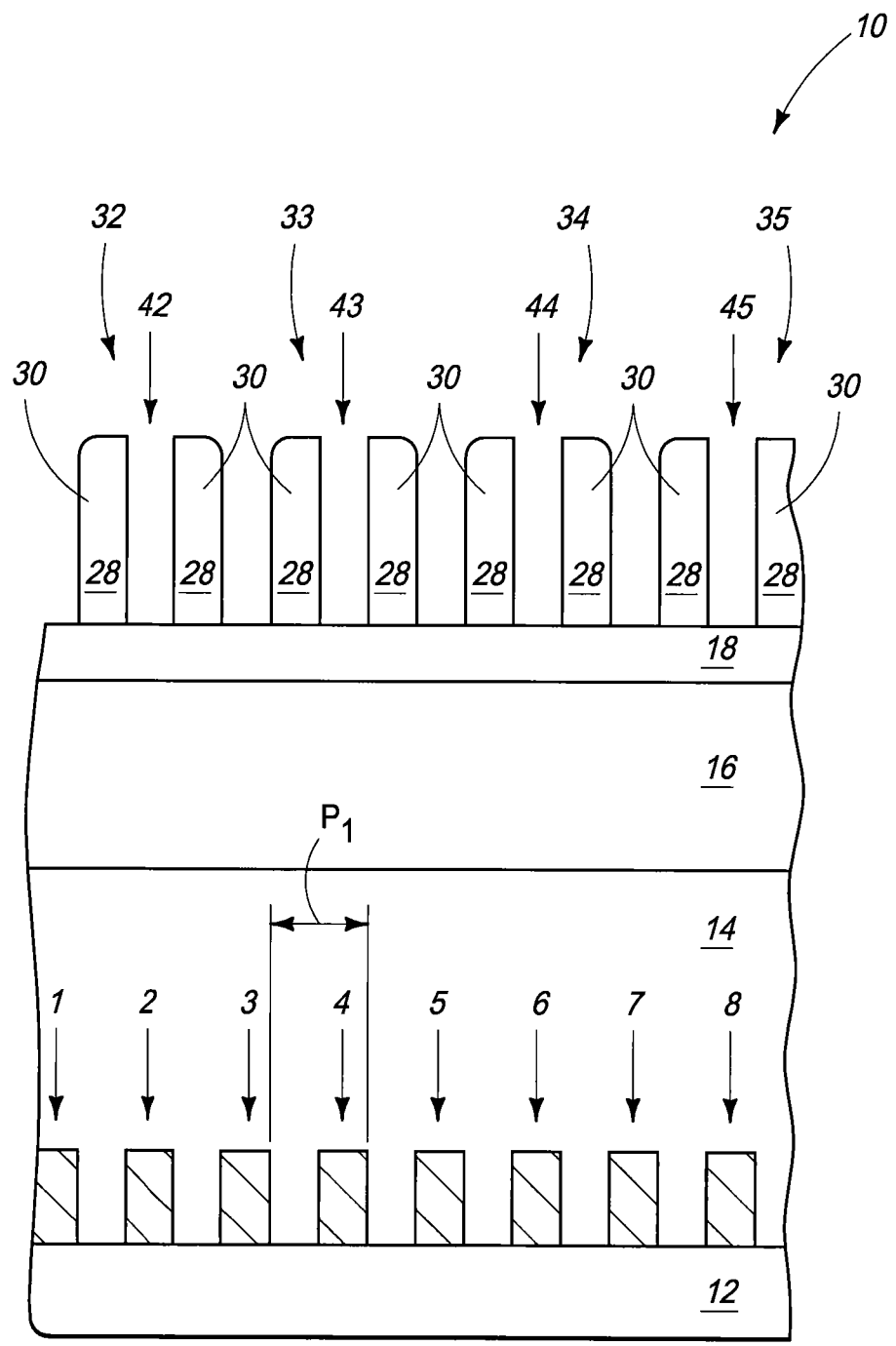
F I G 10

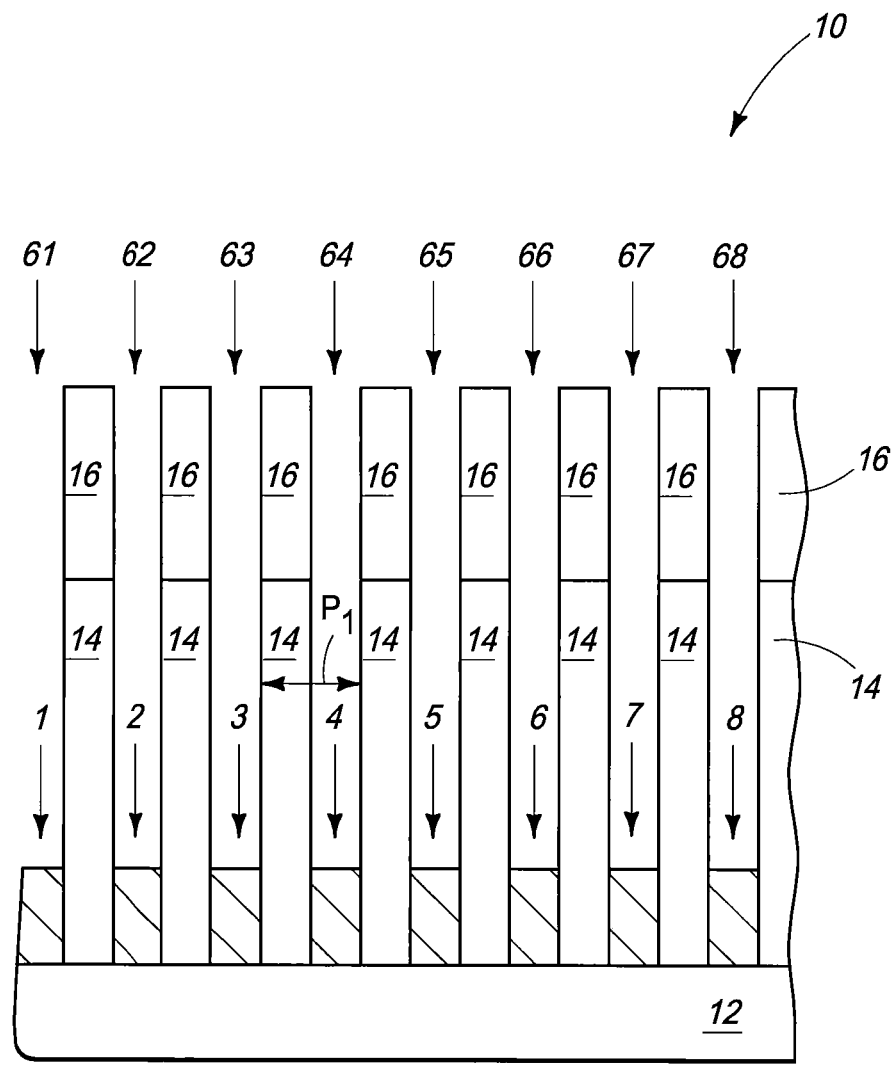
_FIG. 14_

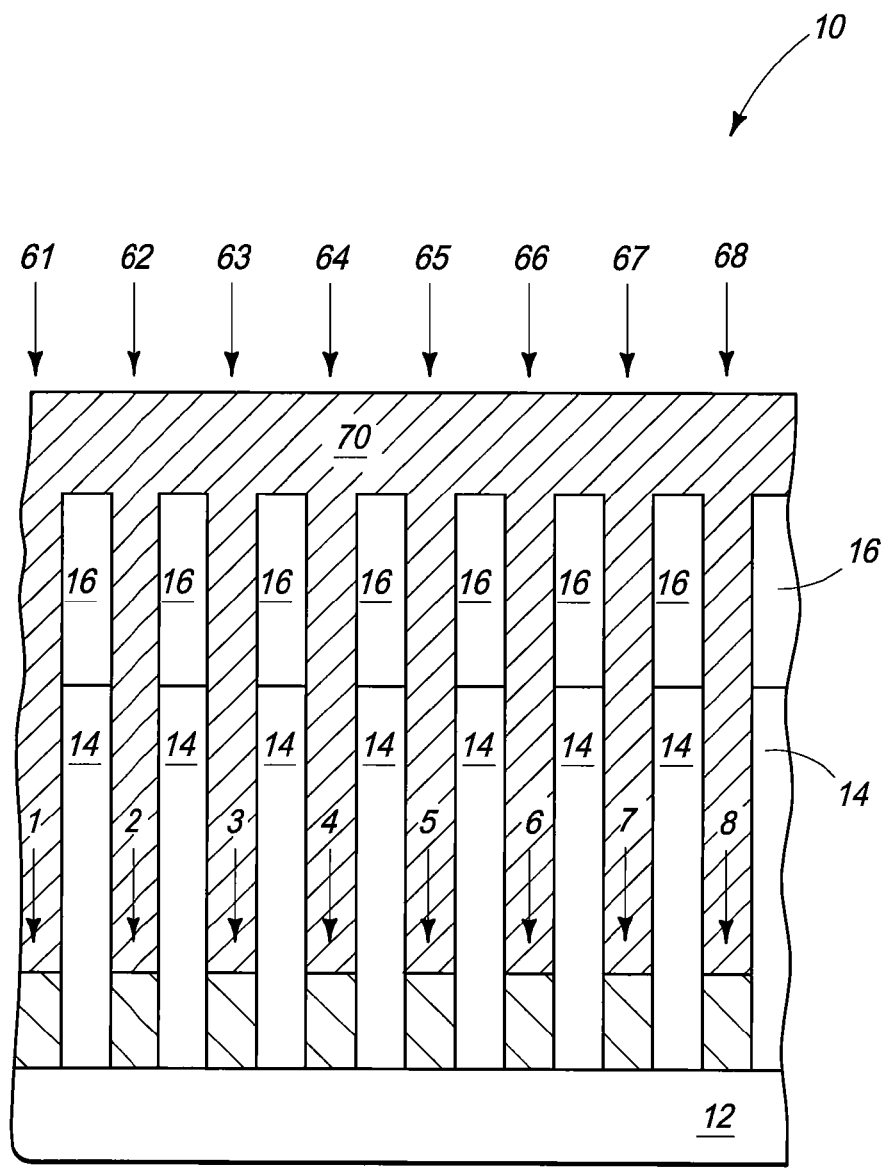
F I G 16

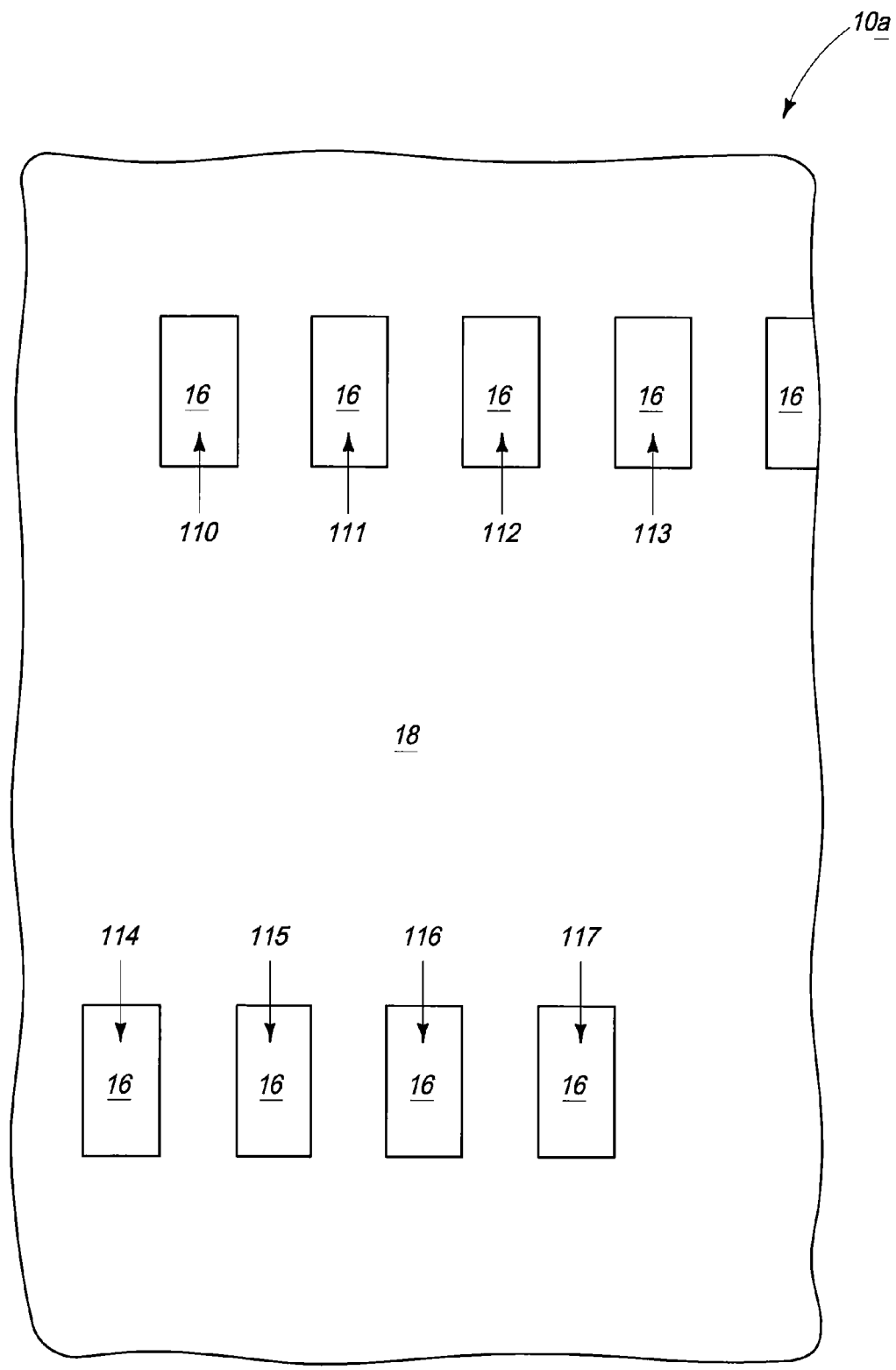

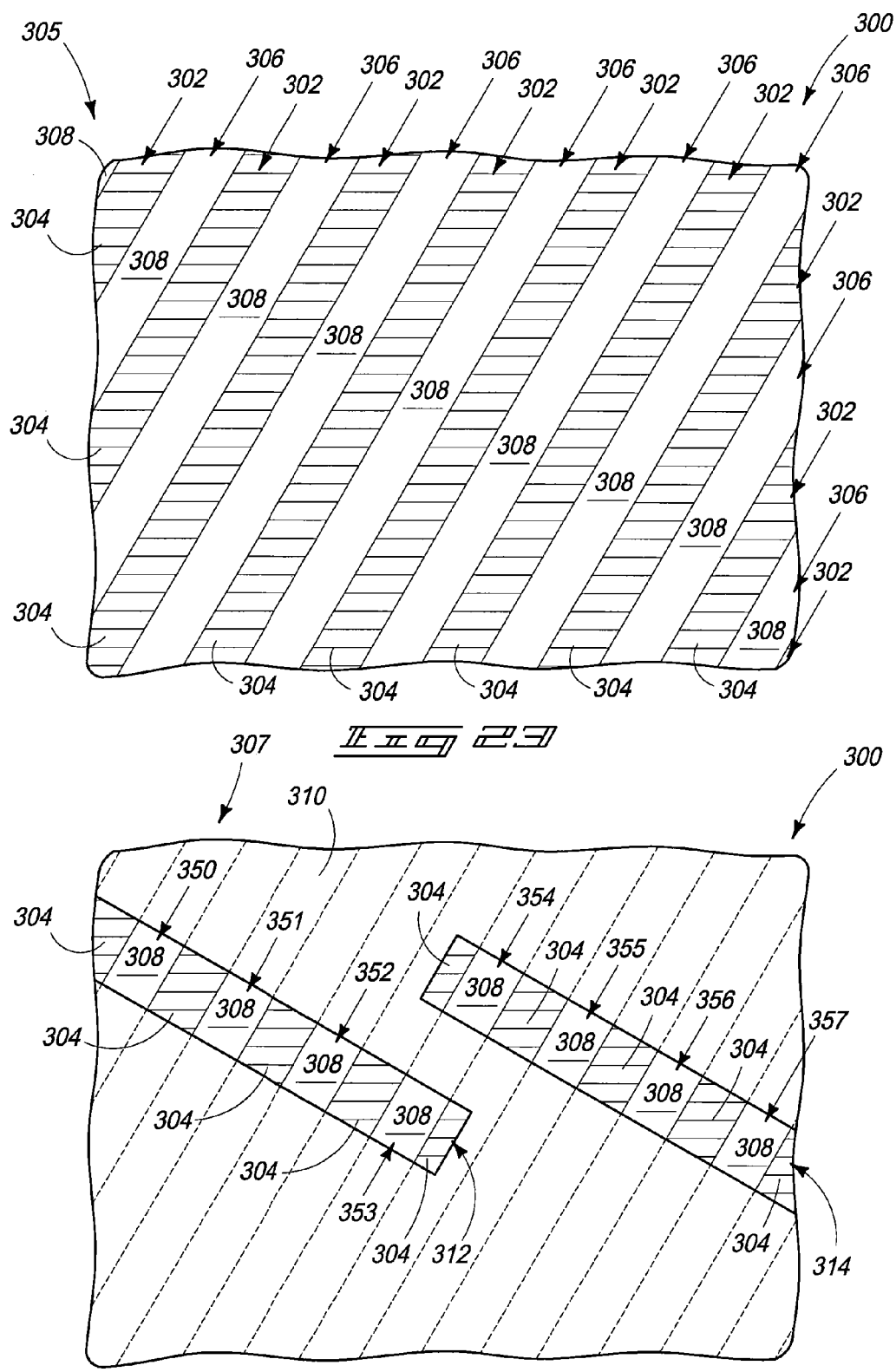

METHODS OF PATTERNING A MATERIAL

RELATED PATENT DATA

This patent resulted from a divisional of U.S. patent application Ser. No. 13/491,466, which was filed Jun. 7, 2012, which is now U.S. Pat. No. 8,389,407, and which is hereby incorporated herein by reference; which resulted from a divisional of U.S. patent application Ser. No. 12/860,765, which was filed Aug. 20, 2010, which is now U.S. Pat. No. 8,216, 939, and which is hereby incorporated herein by reference.

TECHNICAL FIELD

Methods of forming openings and methods of patterning a material.

BACKGROUND

Numerous applications exist in which it is desired to form repeating patterns having a small pitch (for example, a pitch of less than about 82 nanometers). For instance, integrated circuit fabrication may involve formation of a repeating pattern of memory-storage units (e.g., NAND unit cells, dynamic random access memory [DRAM] unit cells, cross-point memory unit cells, etc.).

A variety of methods have been developed for creating patterned masks suitable for patterning underlying materials during fabrication of integrated circuit components. A continuing goal of integrated circuit fabrication is to increase integrated circuit density, and accordingly to decrease the size of individual integrated circuit components. There is thus a continuing goal to form patterned masks having increasing densities of various patterned features.

There can be particular difficulties in forming suitable masks for patterning openings to make contacts to tightly packed circuitry (for example, for patterning contact openings to the various circuit lines associated with NAND or other memory), and the difficulties are becoming ever more challenging with increasing levels of integration. Accordingly, it is desirable to develop new methods for patterning contact openings.

BRIEF DESCRIPTION OF THE DRAWINGS

FIGS. 9 and 10 are a diagrammatic top view and a diagrammatic cross-sectional side view, respectively, of the construction of FIGS. 1 and 2 shown at processing stage subsequent to that of FIGS. 7 and 8. The view of FIG. 10 is along the line 10-10 of FIG. 9.

FIGS. 13 and 14 are a diagrammatic top view and a diagrammatic cross-sectional side view, respectively, of the construction of FIGS. 1 and 2 shown at processing stage subsequent to that of FIGS. 11 and 12. The view of FIG. 14 is along the line 14-14 of FIG. 13.

FIGS. 15 and 16 are a diagrammatic top view and a diagrammatic cross-sectional side view, respectively, of the construction of FIGS. 1 and 2 shown at processing stage subsequent to that of FIGS. 13 and 14. The view of FIG. 16 is along the line 16-16 of FIG. 15.

FIGS. 17-19 are diagrammatic top views of a semiconductor construction at various process stages of another example embodiment.

FIGS. 23-25 are diagrammatic top views of a semiconductor construction at various process stages of another example embodiment.

DETAILED DESCRIPTION OF THE ILLUSTRATED EMBODIMENTS

Some embodiments are directed toward processes of forming tightly-packed patterns of openings through the utilization of two overlapping patterned masks. One of the patterned masks may comprise features formed utilizing pitch-multiplication methodologies so that such features may comprise dimensions smaller than can be obtained utilizing photolithography alone.

Some embodiments are directed toward semiconductor constructions which may be formed and utilized in some of the example embodiment processes of forming openings; such as constructions comprising two overlapping masks that together define a pattern of openings over a semiconductor substrate.

Figure 17:
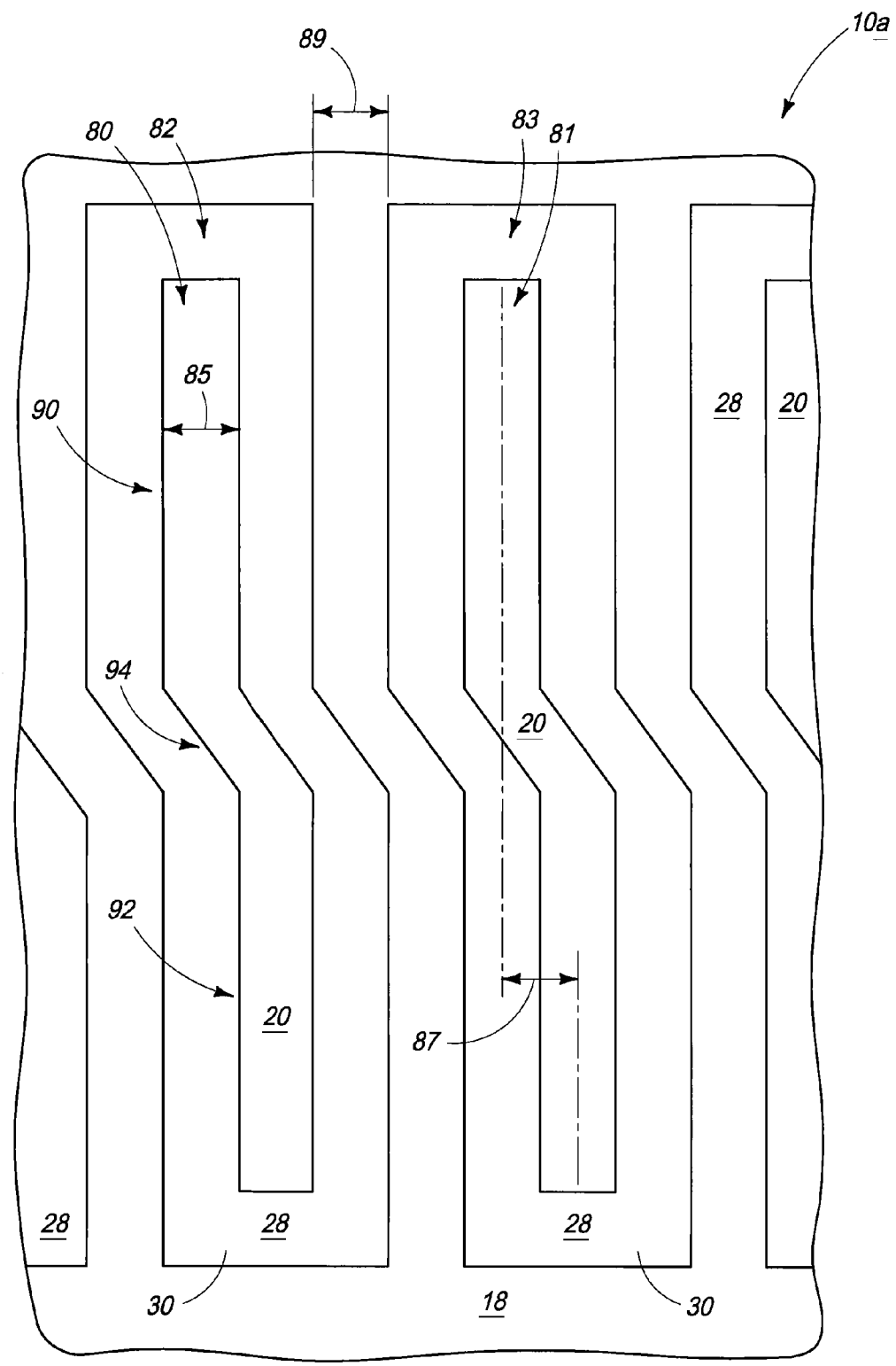
Figure 18B:
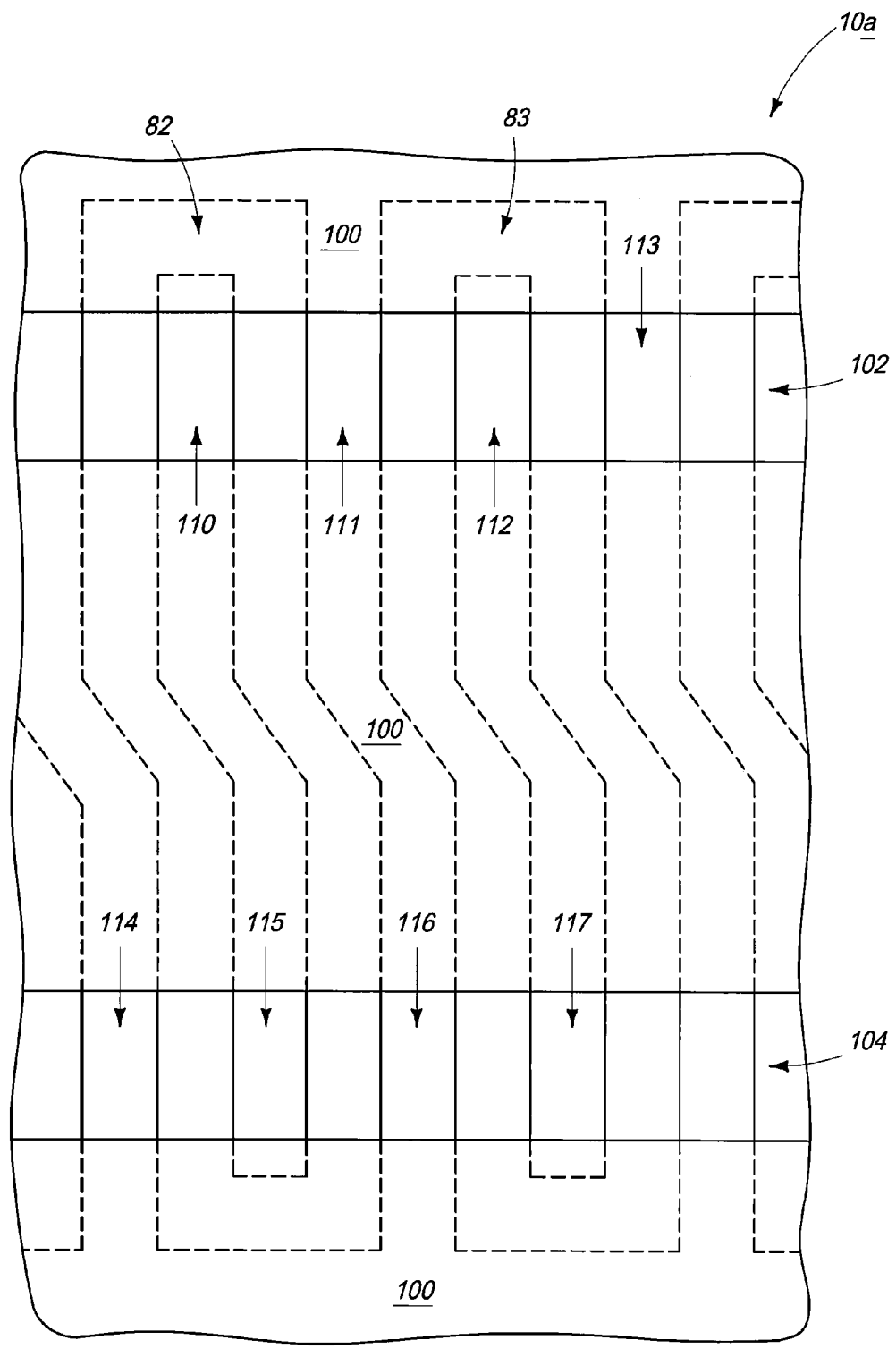
Figure 20:
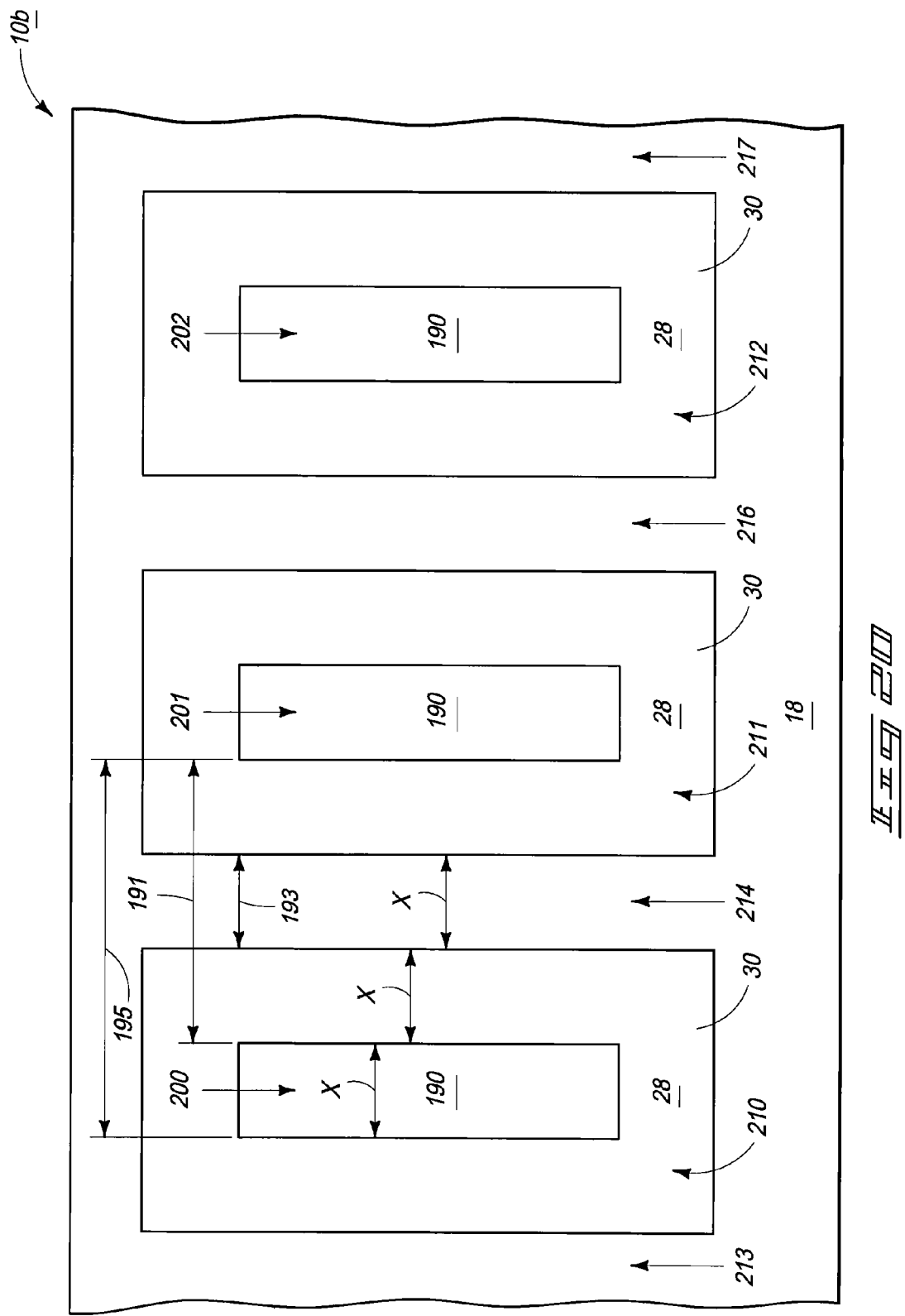
FIGS. 20-22 are diagrammatic top views of a semiconductor construction at various process stages of another example embodiment.
Figure 21:
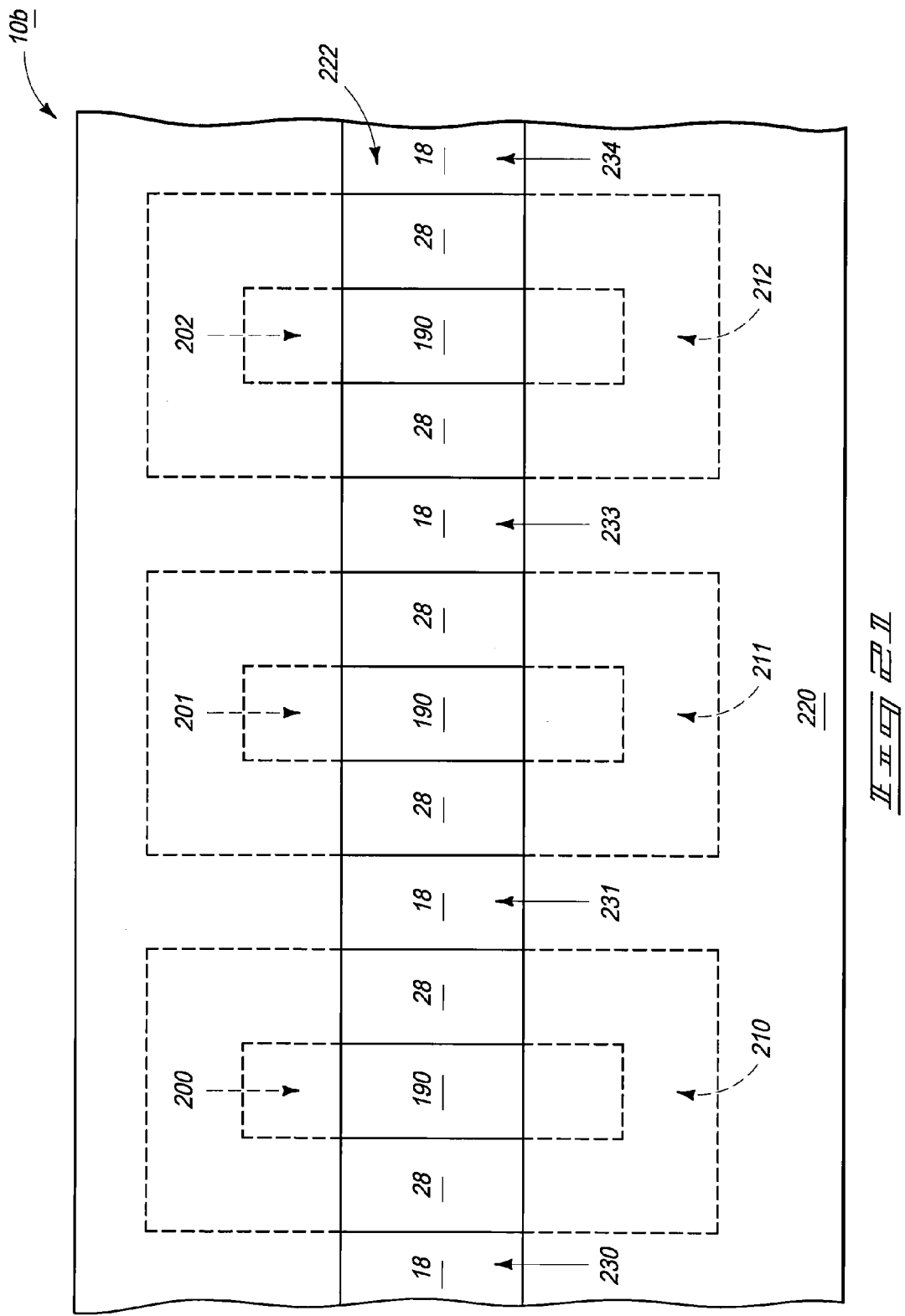
Figure 22:
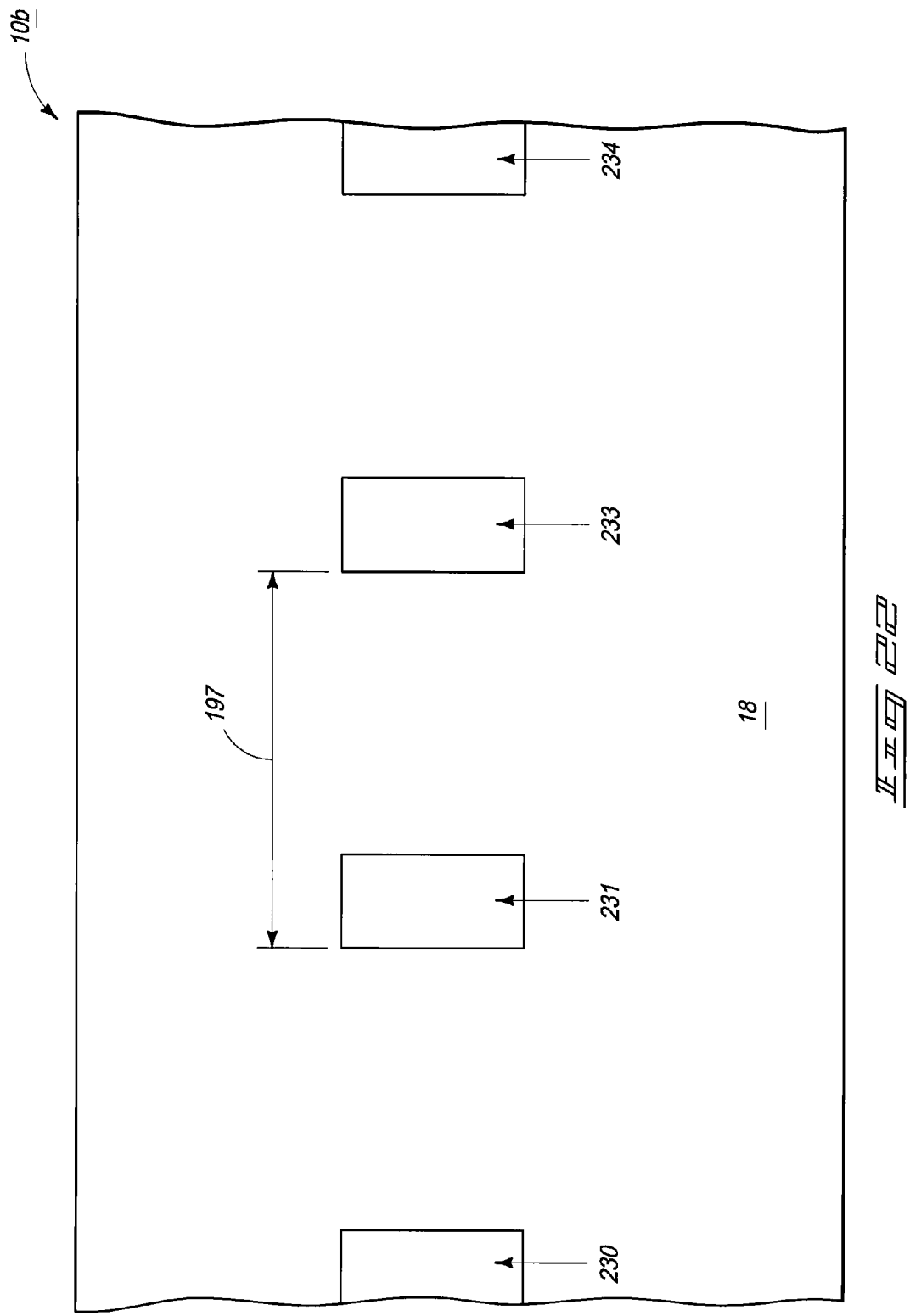
Figure 25:
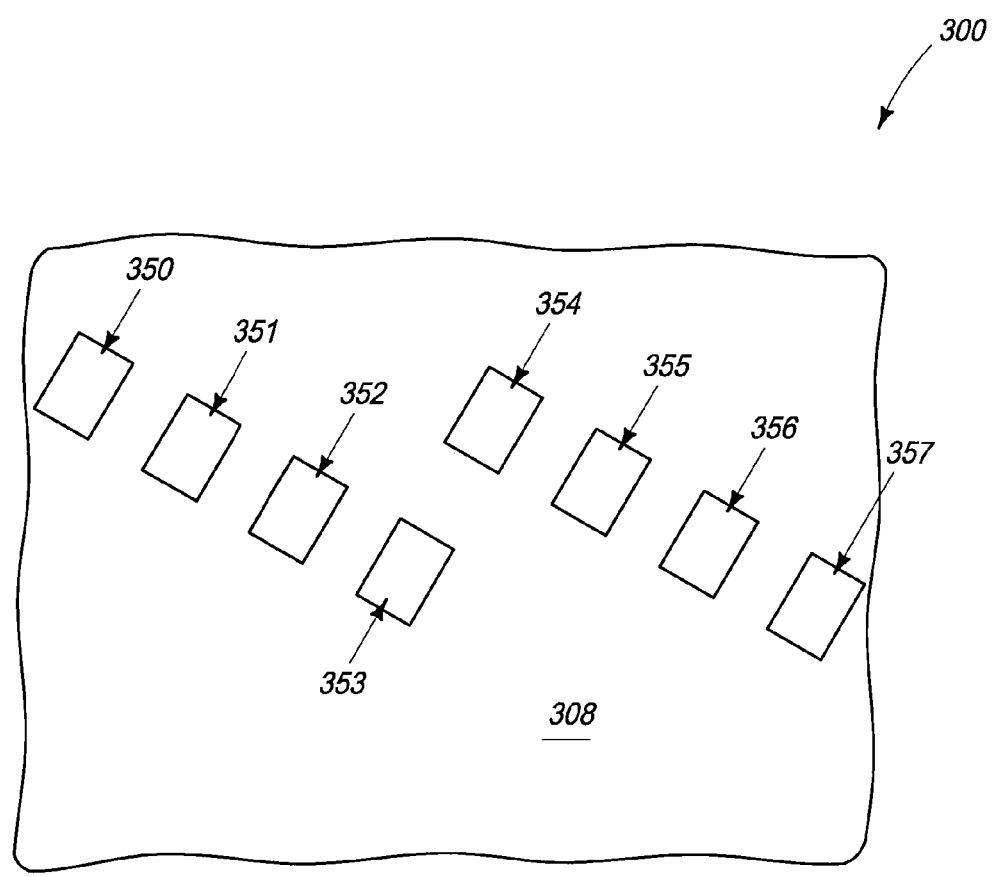

Example embodiments are described with reference to FIGS. 1-22; with FIGS. 1-16 illustrating a first example embodiment process, FIGS. 17-19 illustrating a second example embodiment process, FIGS. 20-22 illustrating a third example embodiment process, and FIGS. 23-25 illustrating a fourth example embodiment process.

Figure 1:
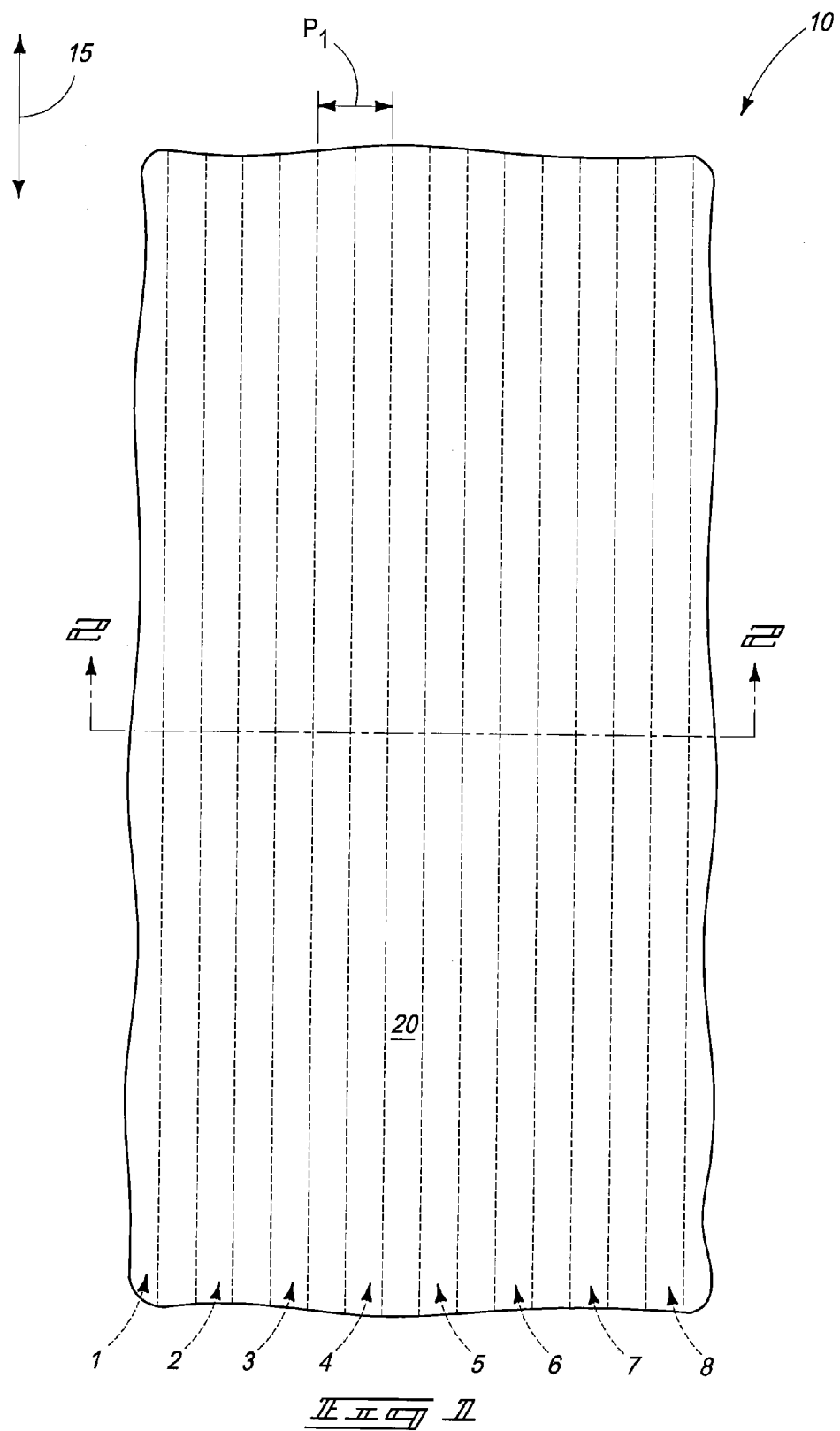
FIGS. 1 and 2 are a diagrammatic top view and a diagrammatic cross-sectional side view, respectively, of a semiconductor construction at a processing stage of an example embodiment. The view of FIG. 2 is along the line 2-2 of FIG. 1.
Figure 2:
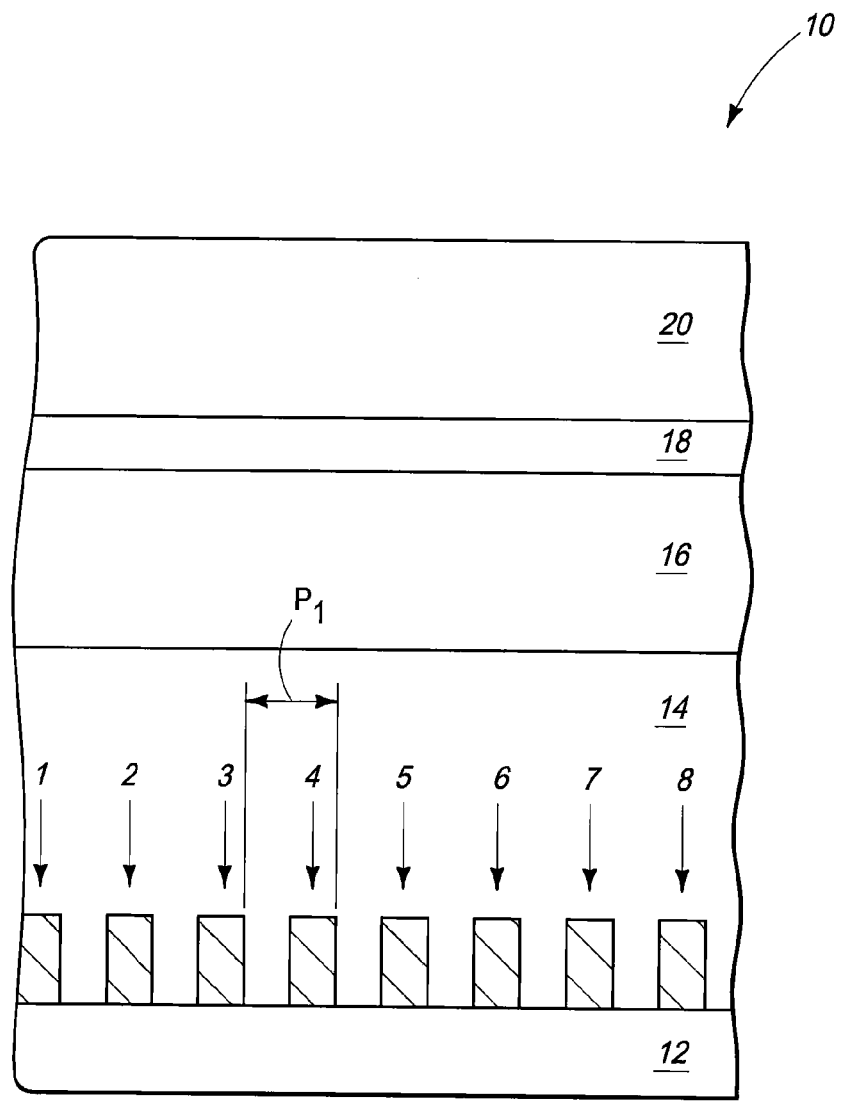

Referring to FIGS. 1 and 2, a semiconductor construction 10 is shown in top view (FIG. 1) and cross-sectional side view (FIG. 2). The construction comprises a semiconductor base 12, a plurality of electrically conductive structures 1-8 formed over the base, and a plurality of materials 14, 16, 18 and 20 formed over the electrically conductive structures.

The semiconductor base 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to the semiconductive substrates described above. Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of refractory metal layers, barrier layers, diffusion layers, insulator layers, etc.

Electrically conductive structures 1-8 are illustrated to be lines that extend in and out of the page relative to the cross-sectional view of FIG. 2; and specifically that are elongated along a direction parallel to an axis 15 (shown in FIG. 1). Such lines are shown in dashed-line (phantom) view in FIG. 1 to indicate that they are beneath other materials.

Some aspects of the invention pertain to methodology which may be utilized to form contact openings to an underlying level of circuitry or other underlying pattern during integrated circuit fabrication. The illustrated lines are an example of conductive structures that may be formed along a level of integrated circuitry. In the shown embodiment the lines 1-8 are at the same elevational level as one another. In other embodiments one or more of the lines may be at an elevational level that is above or below others of the lines. The lines 1-8 may be bitlines, wordlines or shallow trench isolation patterns in some embodiments.

The lines 1-8 are formed to a pitch $P_1$. In some embodiments $P_1$ may be a sub-lithographic pitch formed utilizing pitch multiplication technologies; such as, for example, pitch doubling technologies. Example pitch multiplication technologies are described in U.S. Pat. No. 5,328,810.

The material 14 that extends over and between the electrically conductive lines is electrically insulative material. Such material may be a silicon oxide-containing material; such as, for example, silicon dioxide, borophosphosilicate glass (BPSG), phosphosilicate glass (PSG), etc. In the shown embodiment material 14 is a single thick material over the lines 1-8. In other embodiments there may be multiple materials over and between the lines in addition to, or alternatively to, the thick material 14.

Material 16 is a carbon-containing material, and in some embodiments may comprise, consist essentially of, or consist of one or both of amorphous carbon and transparent carbon. The carbon-containing material 16 is shown to be directly against the insulative material 14. In other embodiments, there may be one or more layers provided between materials 14 and 16. For example, a silicon nitride-containing layer may be provided between materials 14 and 16.

Material 18 is hardmask. In some embodiments material 18 may correspond to a deposited antireflective coating (DARC); and thus may comprise, consist essentially of, or consist of silicon oxynitride.

Material 20 is a masking material, and in some embodiments may comprise, consist essentially of, or consist of photoresist.

Figure 3:
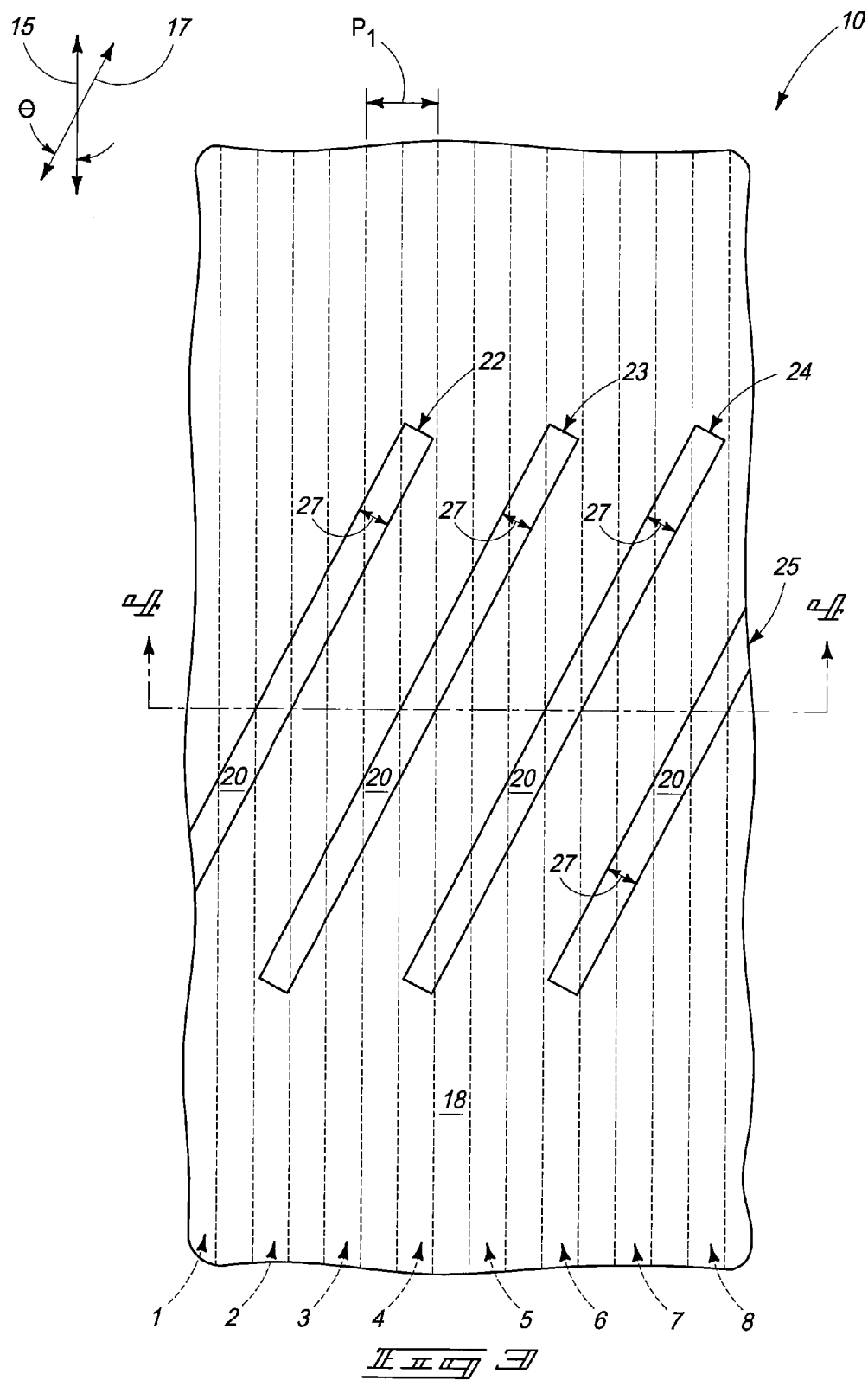
FIGS. 3 and 4 are a diagrammatic top view and a diagrammatic cross-sectional side view, respectively, of the construction of FIGS. 1 and 2 shown at processing stage subsequent to that of FIGS. 1 and 2. The view of FIG. 4 is along the line 4-4 of FIG. 3.
Figure 4:
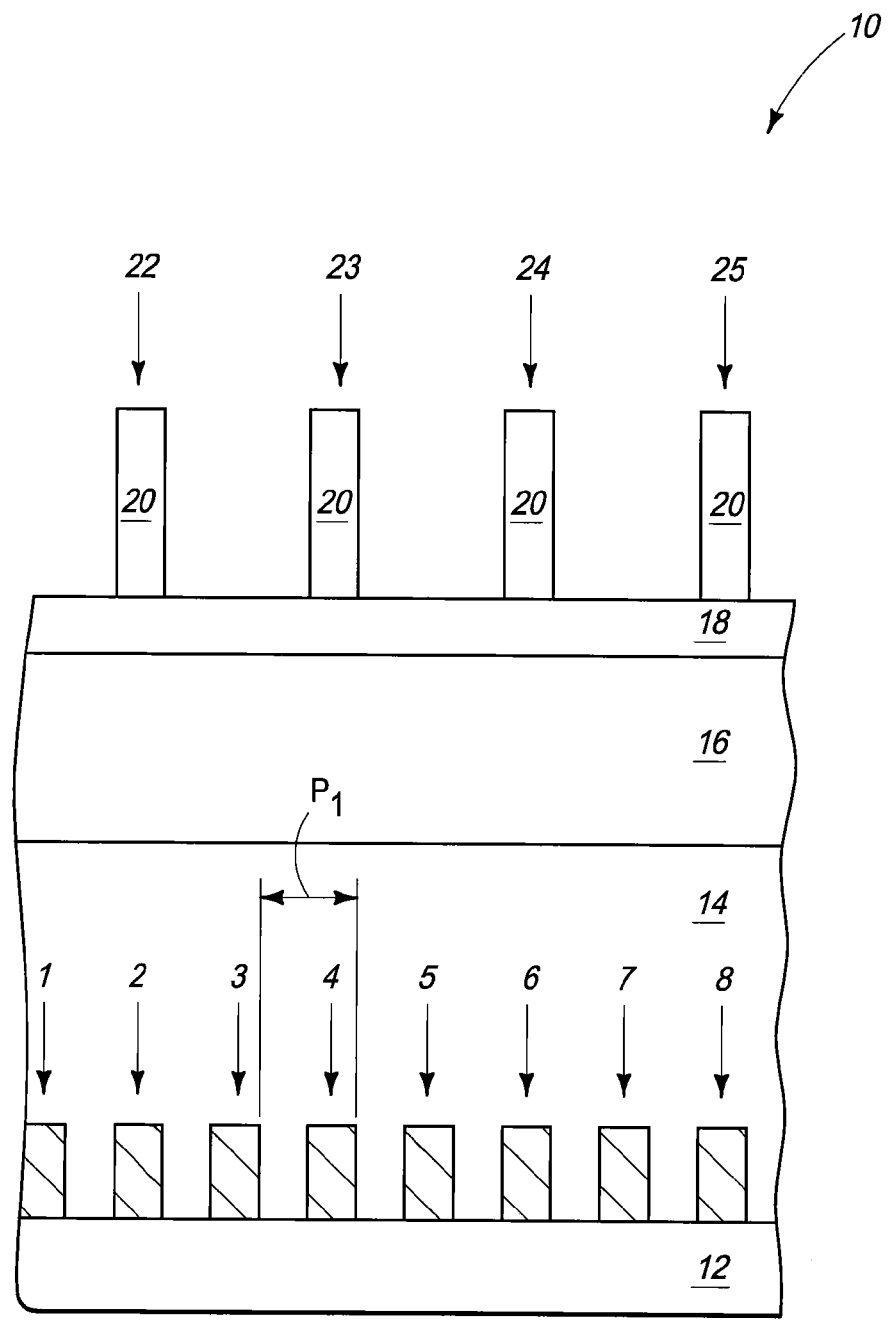

Referring to FIGS. 3 and 4, masking material 20 is patterned into a plurality of lines 22-25. The masking material lines 22-25 are parallel to one another. The lines 22-25 extend primarily along a direction parallel to an axis 17. In some embodiments the axis 15 along which the conductive lines 1-8 primarily extend may be referred to as a first axis and the axis 17 may be referred to as a second axis which intersects the first axis. The second axis 17 intersects the first axis 15 at an angle θ (theta). The angle θ may be less than 90° in some embodiments, less than 45° in some embodiments, and in the shown embodiment is about 27°.

Each of the individual lines 22-25 has a width 27 corresponding to about $\frac{1}{2}P_1 \cos(\theta)$. In embodiments in which masking material 20 comprises photoresist, and in which the pitch $P_1$ is sub-lithographic, the lines 22-25 can be formed to the sub-lithographic width 27 by first photolithographically forming the lines to an initial lithographic width and then chemically trimming the lines to reduce the width to a desired sub-lithographic width, or by overexposure.

Figure 5:
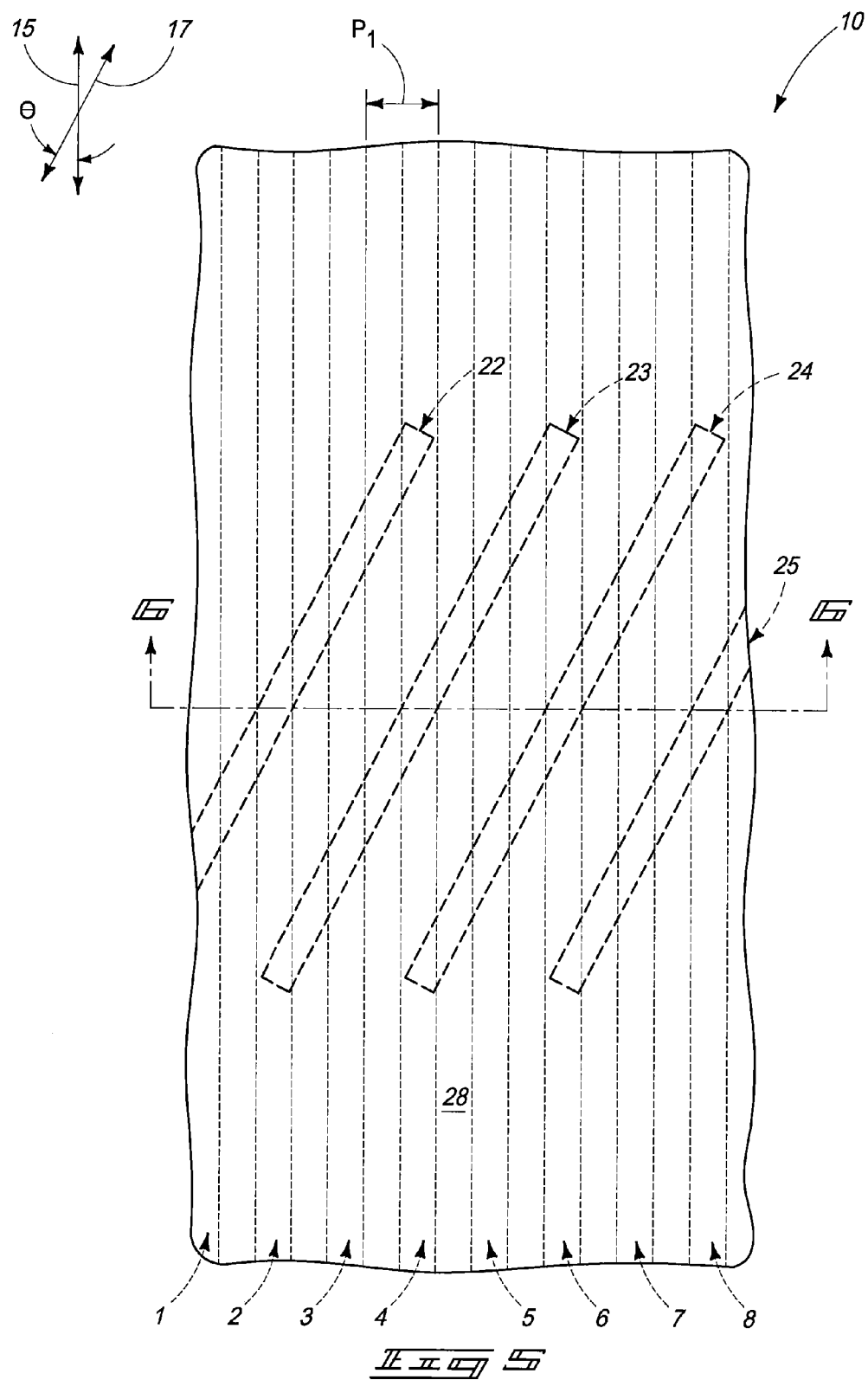
FIGS. 5 and 6 are a diagrammatic top view and a diagrammatic cross-sectional side view, respectively, of the construction of FIGS. 1 and 2 shown at processing stage subsequent to that of FIGS. 3 and 4. The view of FIG. 6 is along the line 6-6 of FIG. 5.
Figure 6:
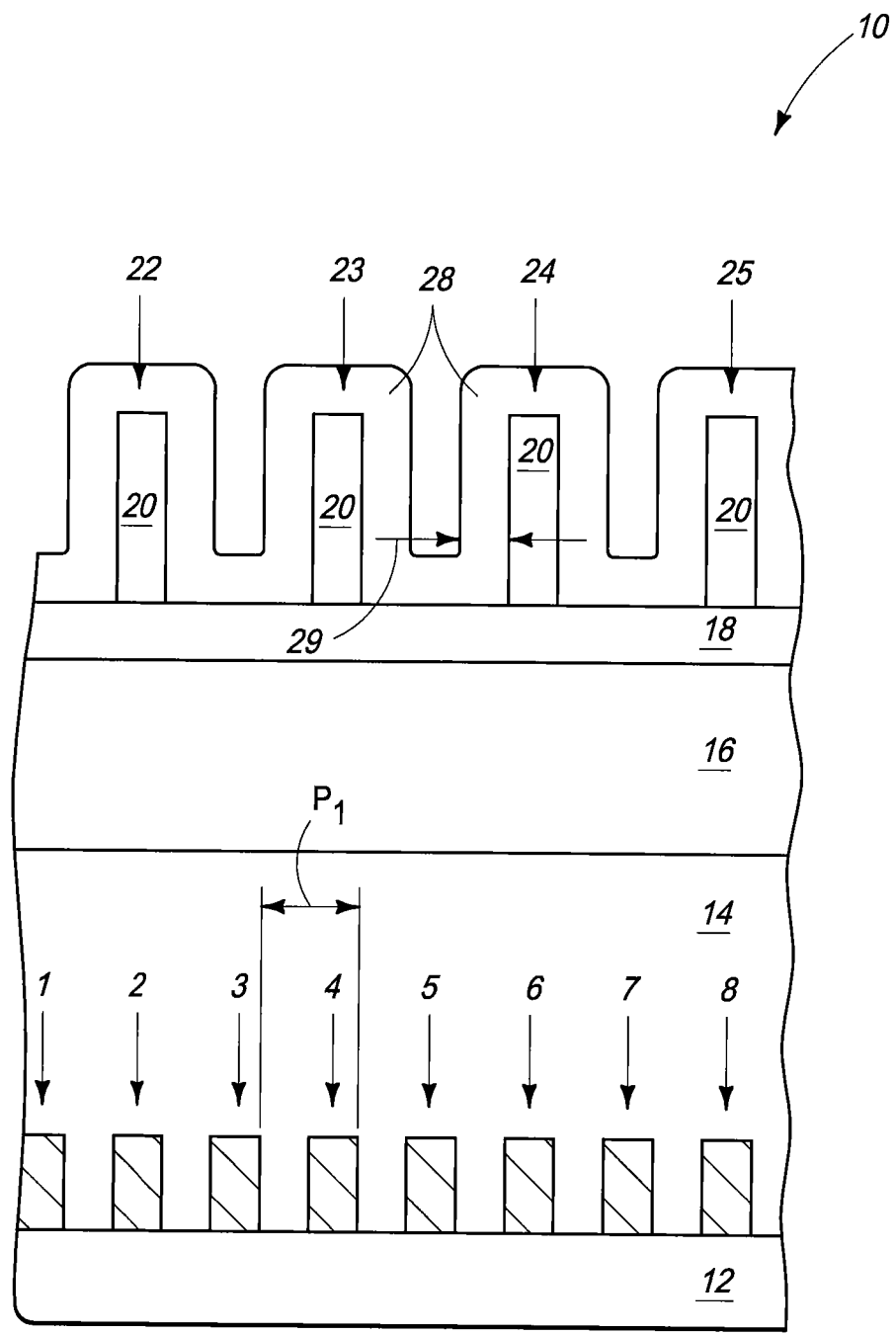

Referring to FIGS. 5 and 6, a layer of material 28 is formed over lines 22-25. The material 28 is ultimately utilized to form spacers (discussed below with reference to FIGS. 7 and 8), and accordingly may be formed to about a desired width of such spacers. In the shown embodiment, material 28 is formed to a thickness 29 which is about the same as the widths 27 (FIG. 3) of the individual lines 22-25. Material 28 may comprise any suitable material, and in some embodiments may comprise, consist essentially of, or consist of silicon dioxide. It may be desired that material 28 be selectively etchable relative to materials 20 and 18 in some embodiments. The lines 22-25 are shown in dashed line in the top view of FIG. 5 to indicate that such lines are beneath material 28.

Material 28 may be formed by any suitable method, including, for example, one or both of atomic layer deposition (ALD) and chemical vapor deposition (CVD).

Figure 7:
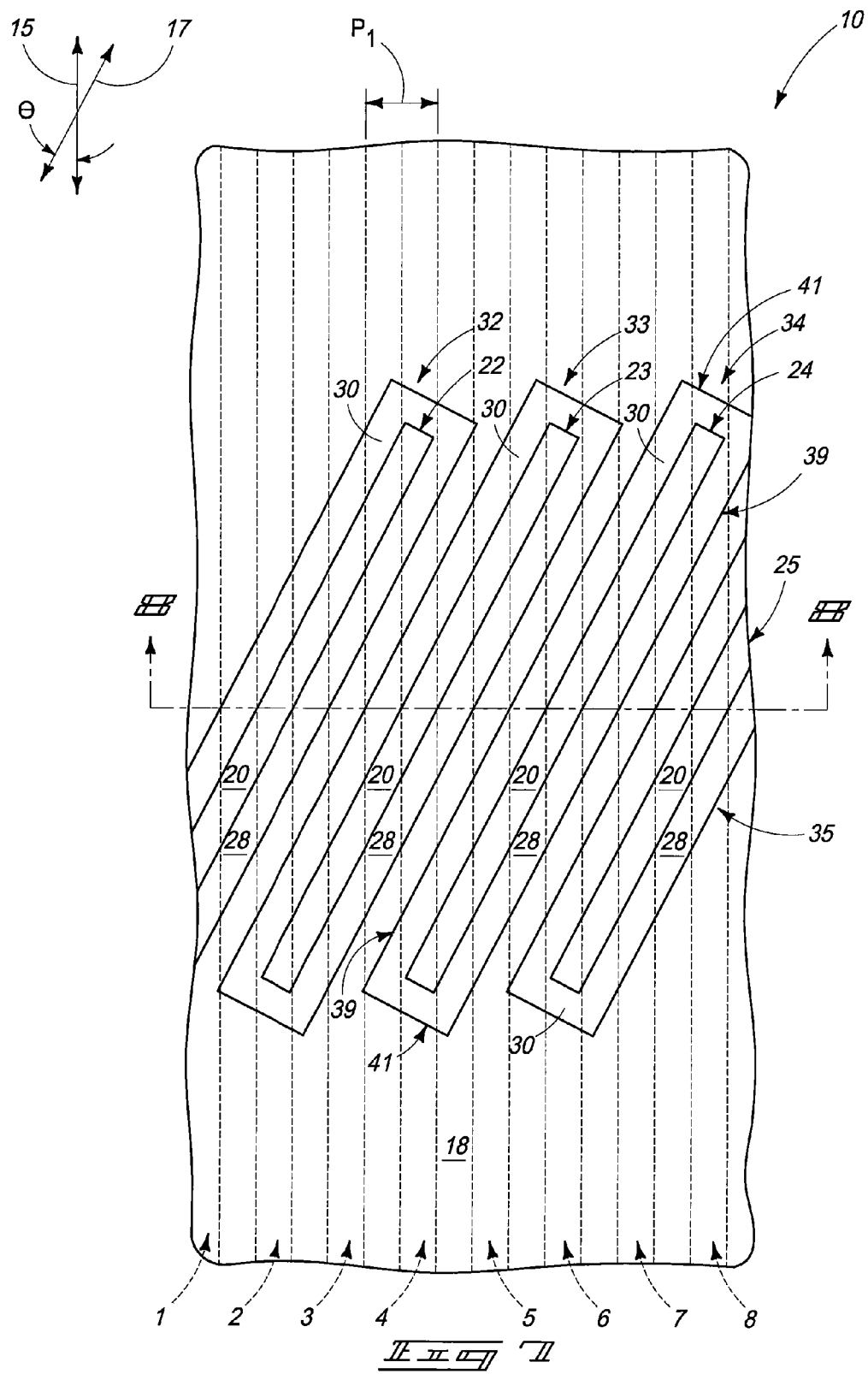
FIGS. 7 and 8 are a diagrammatic top view and a diagrammatic cross-sectional side view, respectively, of the construction of FIGS. 1 and 2 shown at processing stage subsequent to that of FIGS. 5 and 6. The view of FIG. 8 is along the line 8-8 of FIG. 7.
Figure 8:
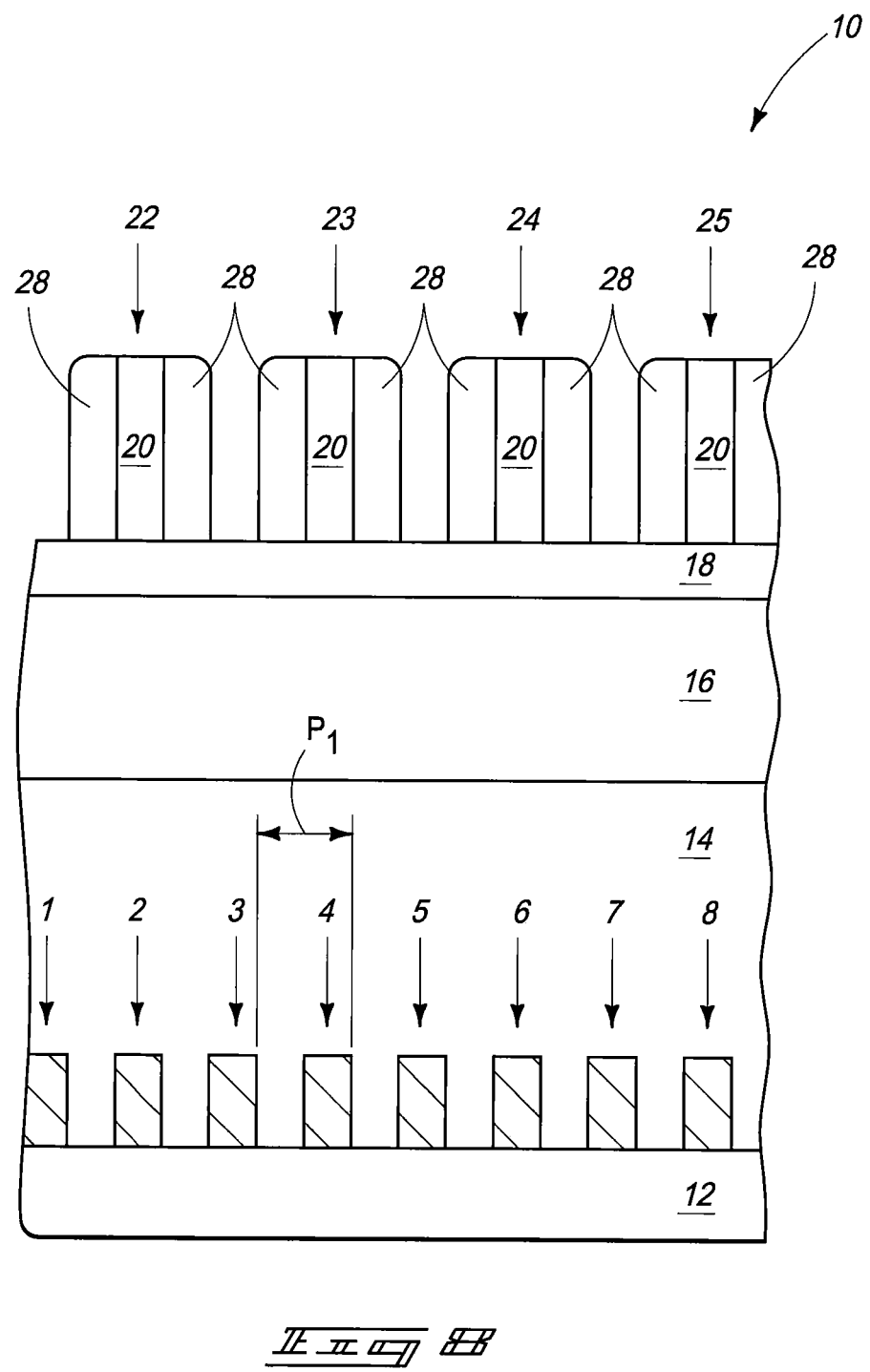

Referring to FIGS. 7 and 8, material 28 is anisotropically etched to form spacers 30 around the lines 22-25. In the shown embodiment the spacers form a plurality of annular rings 32-35, with each individual ring being around one of the lines 22-25.

The rings 32-35 are shown to be rectangular, and to be elongated along the direction of axis 17. Thus, each of the individual rings has two long sides 39 (shown relative to ring 34 in FIG. 7), and two short sides 41 (also shown relative to ring 34 in FIG. 7). Each of the long sides and short sides is a single straight segment in the shown embodiment. In other embodiments the annular rings may have other shapes, such as other shapes elongated along axes 17. Such other shapes may have long sides and short sides analogous to the shown rectangular-shaped rings, but at least some of the long sides and/or short sides may have a different conformation then the shown single straight segments (for instance, two or more of the sides may be wavy).

In the shown embodiment the long segments 39 of ring 34 are straight segments that extend along the second axis 17. In embodiments in which the long segments are not straight (for instance, embodiments in which the long segments are curved or wavy), the long segments may be considered to extend primarily along the second axis 17.

Figure 9:
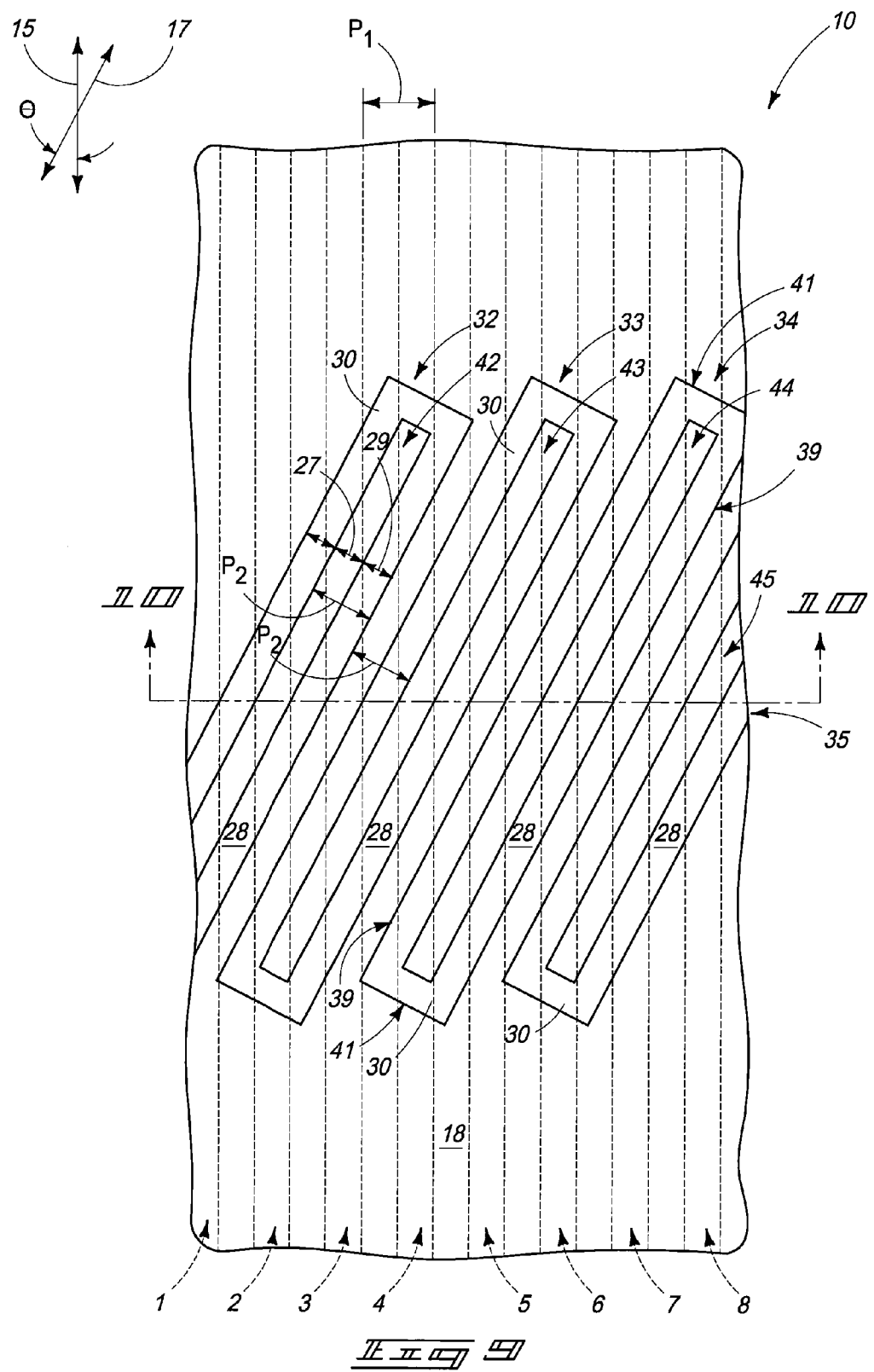

Referring to FIGS. 9 and 10, masking material 20 (FIGS. 7 and 8) is removed to leave openings 42-45 within the annular rings 32-35, respectively. In the shown embodiment openings 42-45 are rectangular-shaped and have the width 27 of the masking material lines 22-25 (shown in FIG. 3). The spacers 30 have widths 29 corresponding to about the initial thickness of material 28 (shown in FIG. 6). In the shown embodiment widths 27 and widths 29 are about the same as one another, and are both about $\frac{1}{2}P_1 \cos(\theta)$. Accordingly, the spacers 30 form a repeating pattern that has a pitch of $P_2$, with $P_2$ being about $P_1 \cos(\theta)$. The repeating pattern formed by spacers 30 at pitch $P_2$ is along an axis orthogonal to the axis 17 along which the rings 32-35 are aligned.

Figure 11:
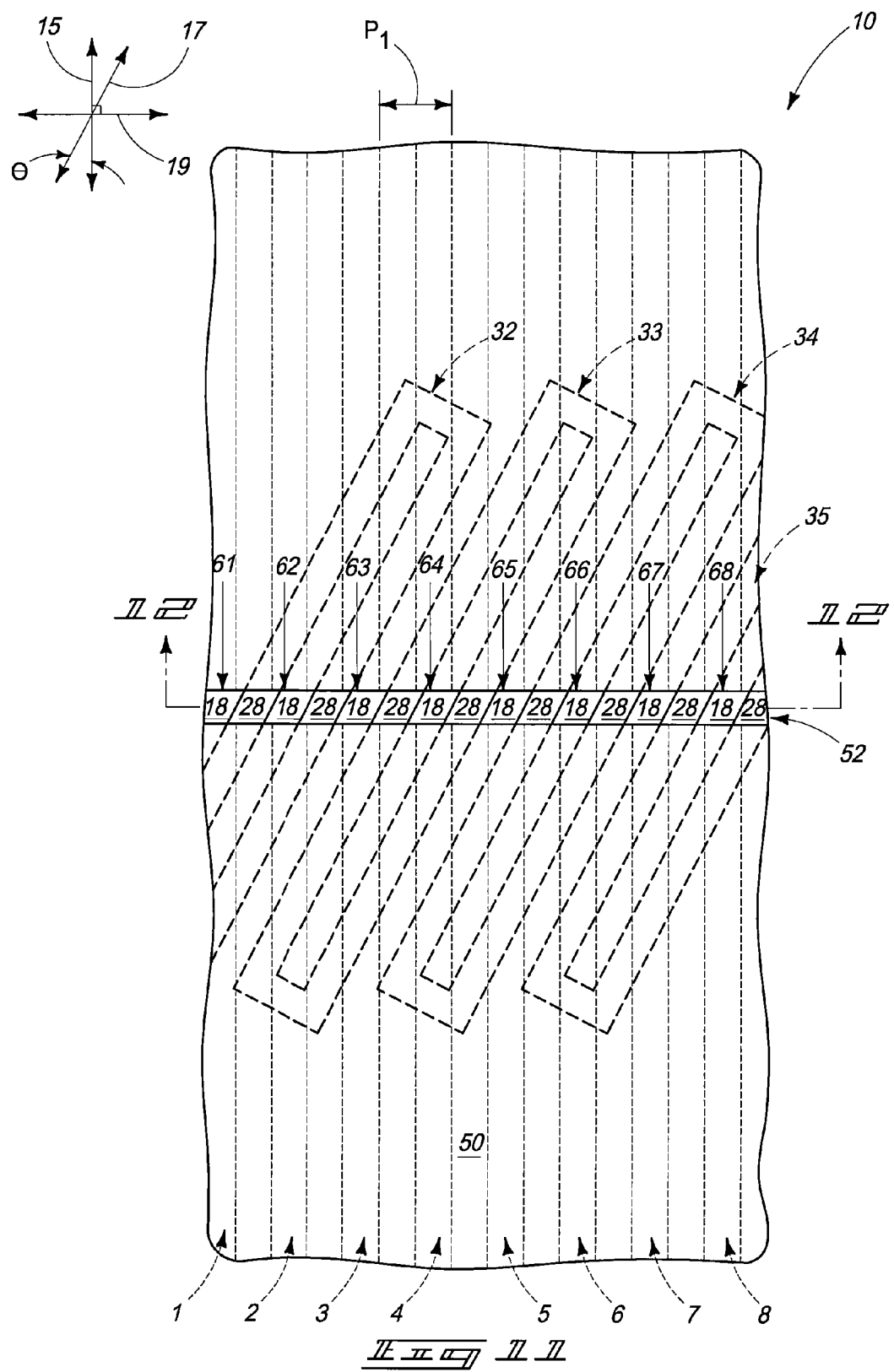
FIGS. 11 and 12 are a diagrammatic top view and a diagrammatic cross-sectional side view, respectively, of the construction of FIGS. 1 and 2 shown at processing stage subsequent to that of FIGS. 9 and 10. The view of FIG. 12 is along the line 12-12 of FIG. 11.
Figure 12:
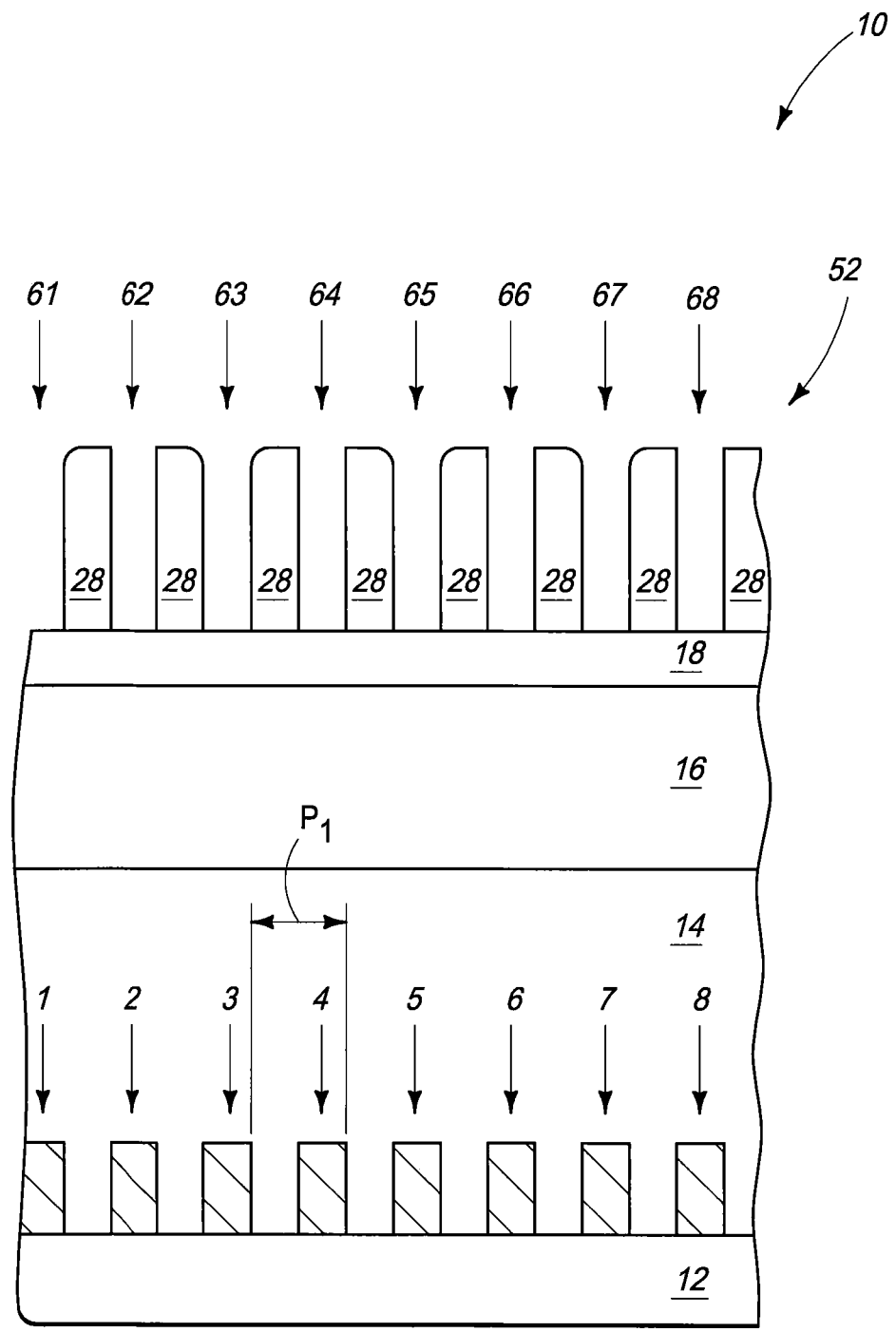

Referring to FIGS. 11 and 12, a patterned masking material 50 is provided over rings 32-35. The patterned masking material 50 has a trench 52 extending therethrough. The shown trench is rectangular and elongated along a direction parallel to an axis 19 which is orthogonal to the axis 15. The trench 52 thus extends perpendicularly to the direction along which the lines 1-8 are elongated. The shown trench is an example configuration, and other configurations may be used in other embodiments. In the example embodiment of FIGS. 11 and 12 the trench may have any suitable shape which provides one contact per conductive line 1-8.

The rings 32-35 are shown in dashed line in the top view of FIG. 11 to indicate that the rings are beneath masking material 50, except for regions of the rings exposed within trench 52.

Masking material 50 may comprise any suitable composition, and in some embodiments may comprise, consist essentially of, or consist of photolithographically patterned photoresist. In some embodiments, the rings 32-35 may be considered to form a first patterned mask, and the masking material 50 may be considered to form a second patterned mask overlying the first patterned mask.

The trench 52 exposes some regions of rings 32-35, while covering other regions of the rings. The exposed regions have a plurality of openings 61-68 that extend down to the material 18. Thus, the patterned masking material 50 and rings 32-35 may be together considered to define a plurality of openings 61-68.

In the shown embodiment each space within the interior of rings 32-25, and each of the spaces between adjacent rings, patterns a single one of the openings 61-68.

In the shown embodiment the masking material 20 (FIGS. 5 and 6) is removed prior to forming patterned masking material 50. In other embodiments masking material 20 may remain within rings 32-35 as masking material 50 is provided over the rings. In some embodiments, materials 20 and 50 may be the same composition as one another (for instance, may both comprise photoresist), and accordingly material 20 may be removed from within openings 61-68 during the same processing step utilized to form trench 52. Thus, if materials 20 and 50 are the same composition as one another, the processing of FIGS. 9 and 10 may be omitted in some embodiments, and instead portions of material 20 exposed within trench 52 may be removed during the processing utilized to form the trench 52.

In some embodiments materials 20 and 50 may be different from one another, and material 20 may remain within rings 32-35 to change a pitch of the openings formed at the processing stage of FIGS. 11 and 12. Specifically, if material 20 remains at the processing stage of FIGS. 11 and 12, then only openings 61, 63, 65 and 67 may be formed, which may effectively increase a pitch of the openings by a factor of 2 relative to embodiments in which all of the openings 61-68 are formed. Such increased pitch may be desired in some applications. Methods for leaving material 20 between spacers to accomplish an increased pitch are discussed in more detail below with reference to FIGS. 20-22.

Figure 13:
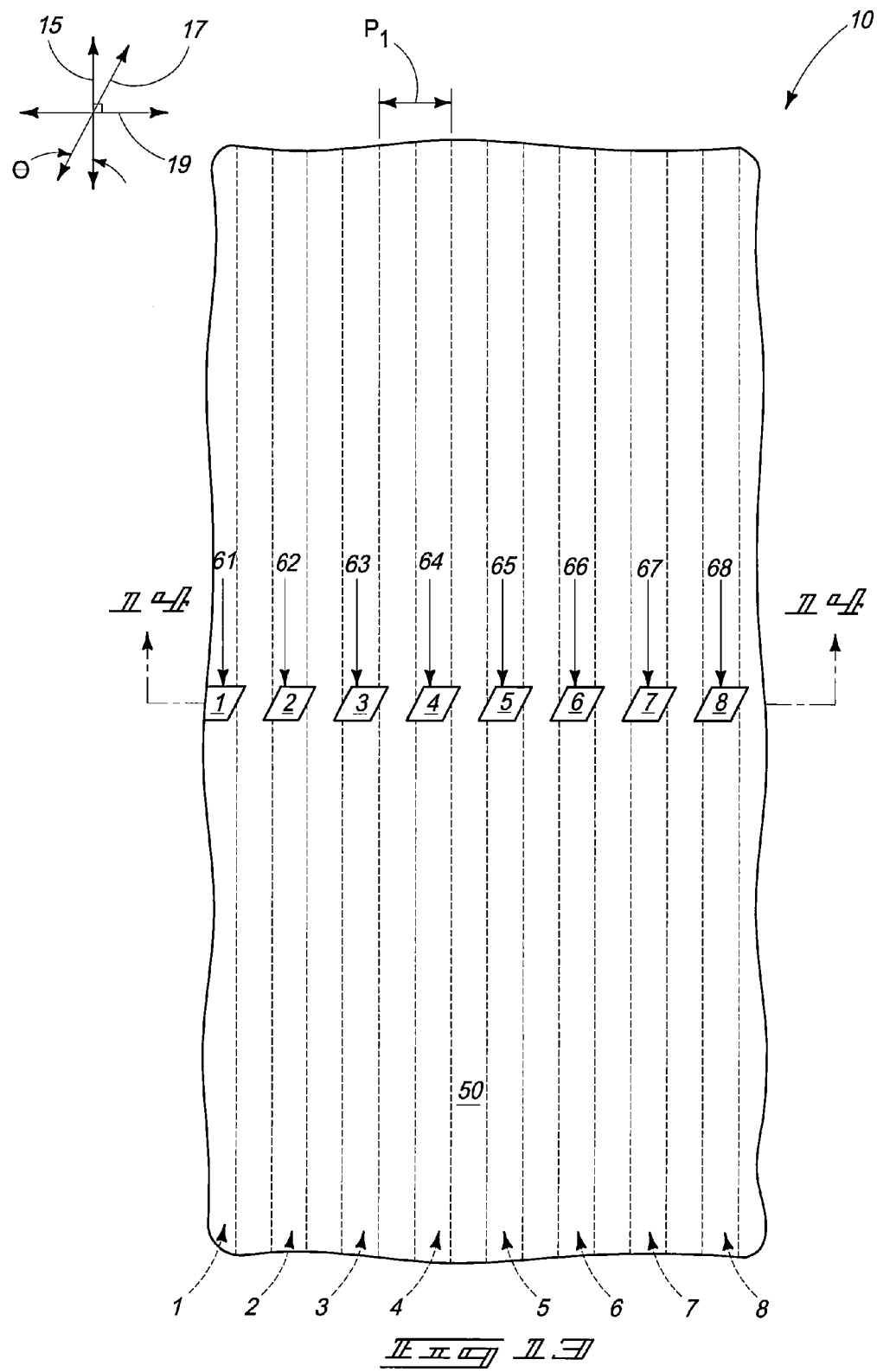

Referring to FIGS. 13 and 14, openings 61-68 are transferred into materials 14 and 16 with one or more suitable etches, and materials 18, 28 and 50 (FIGS. 11 and 12) are removed. In some embodiments the openings 61-68 may be initially transferred into hardmask material 18, then materials 28 and 50 may be removed from over the hardmask, then the openings are transferred from hardmask material 18 into underlying materials 14 and 16 with one or more suitable etches, and then the hardmask material 18 is removed.

The openings 61-68 extend to conductive lines 1-8 at the processing stage of FIGS. 13 and 14, and thus are contact openings to the lines.

Figure 15:
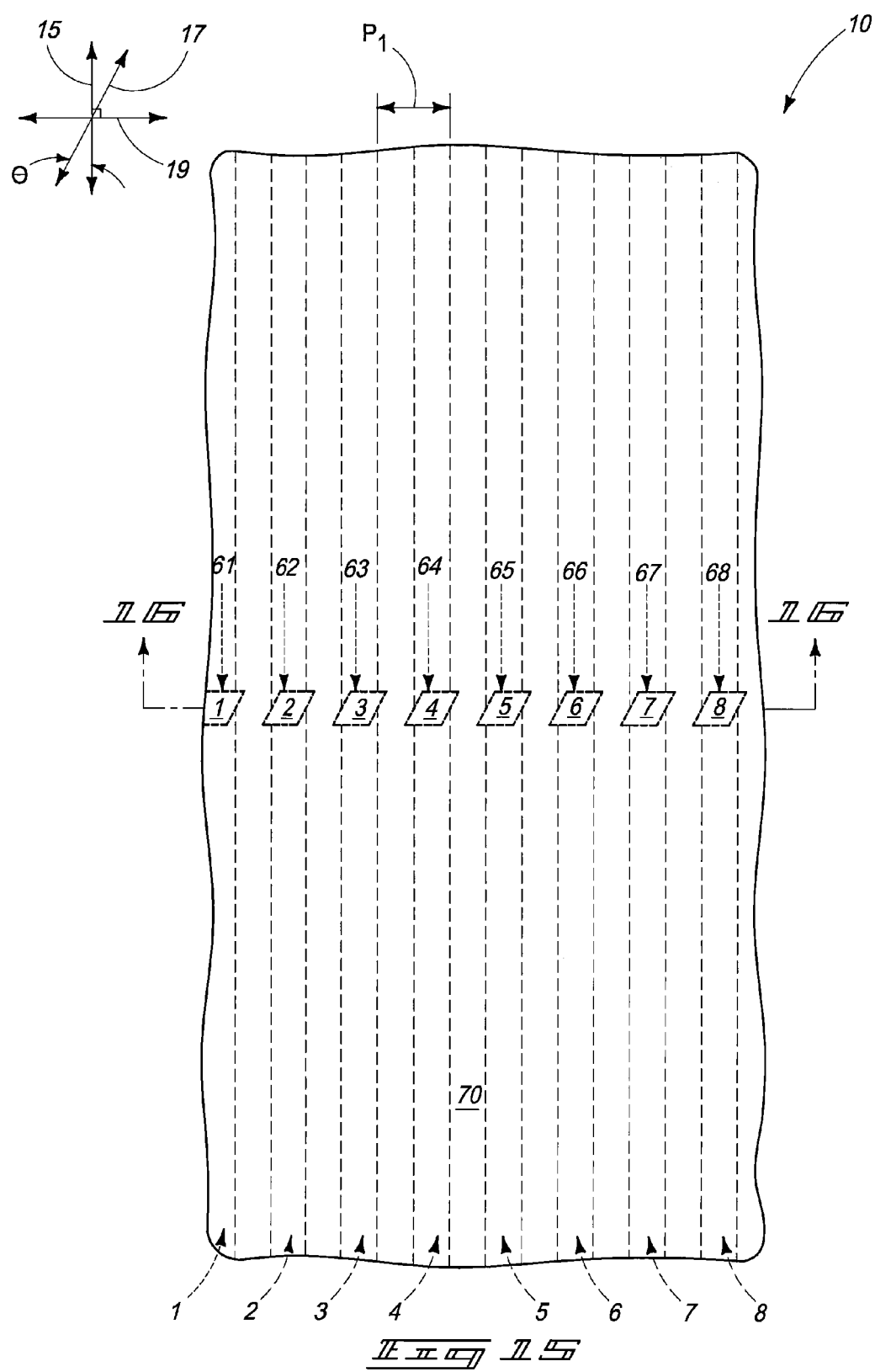

Referring to FIGS. 15 and 16, electrically conductive material 70 is formed within openings 61-68 to form electrically conductive contacts extending to the lines 1-8. The conductive material may be left as is to electrically interconnect all of lines 1-8 to one another. Alternatively, in subsequent processing (not shown) the conductive material 70 may be removed from an upper surface of construction 10 to form a plurality of separate contacts to the various conductive lines. The material 70 may be removed from over the top of construction 10 with any suitable processing; such as, for example, chemical-mechanical processing (CMP).

The rings 32-35 of the embodiment of FIGS. 1-16 are one of many configurations of rings that may be utilized in various embodiments. FIGS. 17-19 illustrate another configuration of rings that may be utilized in some embodiments. Similar numbering will be used to describe FIGS. 17-19 as was used above in describing FIGS. 1-16, where appropriate.

Referring to FIG. 17, a semiconductor construction 10*a* is shown in top view. The semiconductor construction may comprise lines analogous to lines 1-8 described above with reference to FIGS. 1-16 (such lines are not shown in the top view of FIG. 20), and may comprise the various materials 14, 16 and 18 described with reference to the cross-sectional view of FIG. 2. The construction 10*a* comprises the patterned material 20 forming a plurality of structures (two of which are labeled as 80 and 81), and comprises anisotropically-etched spacer material 28 forming spacers 30 around the structures of material 20. The spacers 30 form a pair of rings 82 and 83 encircling the structures 80 and 81, respectively.

Each of the structures 80 and 81 is of the same shape. Such shape is described relative to structure 80. The shape has a first linear segment 90, a second linear segment 92 laterally offset from the first linear segment, and a jog 94 connecting the first and second linear segments to one another. The first and second linear segments are parallel to one another.

The structures 80 and 81 define interior regions of the rings 82 and 83; and accordingly the interior regions of the rings may be considered to comprise linear segments and jogs analogous to the linear segments and jogs of the structures 80 and 81.

The structure 80 has a width 85. A center of the first linear segment 90 is laterally offset from a center of the second linear segment 92 by a distance 87 (shown relative to structure 81). In the shown embodiment, the distance 87 is about the same as the width 85. Also, the rings 82 and 83 are spaced from one another by a distance 89, and in the shown embodiment distance 89 is the same as the distance 87.

Referring to FIG. 18, structures 80 and 81 are removed, and a patterned masking material 100 is provided over rings 82 and 83. The patterned masking material 100 may comprise, for example, photoresist.

The patterned masking material has a pair of trenches 102 and 104 extending therethrough. The patterned masking material 100, together with rings 82 and 83 defines a plurality of openings across an upper surface of construction 10*a* (some of the openings are labeled as 110-117 in FIG. 18). The openings are arranged in two rows, with one of the rows comprising the openings 110-113 defined within trench 102, and the other of the rows comprising the openings 114-117 defined within trench 104.

Referring to FIG. 19, the openings 110-117 are extended into the material 18 underlying rings 82 and 83 (FIG. 18); and subsequently the masking material 100 (FIG. 18), and the rings 82 and 83, are removed. The openings may be extended into silicon dioxide-containing material, carbon-containing material, and hardmask material analogous to the materials 14, 16 and 18 of FIG. 2; and are shown extending to a carbon-containing material 16.

As discussed above with reference to the processing of FIGS. 11 and 12, there may be embodiments in which it is desired to leave patterned material within masking material rings so that openings are only formed in the locations of spaces between the rings. FIGS. 20-22 show an example embodiment utilizing such processing. Similar numbering will be used to describe FIGS. 20-22 as was used above in describing FIGS. 1-16, where appropriate.

Referring to FIG. 20, a semiconductor construction 10b is shown in top view. The semiconductor construction may comprise lines analogous to the lines 1-8 described above with reference to FIGS. 1-16 (such lines are not shown in the top view of FIG. 20), and may comprise the various materials 14, 16 and 18 described with reference to the cross-sectional view of FIG. 2. The construction 10b is shown comprising the material 18 as a surface supporting various masking structures.

The construction 10b comprises a patterned material 190 forming three rectangular features 200-202, and comprises anisotropically-etched spacer material 28 forming spacers 30 around the features 200-202. The spacers 30 form rings 210-212 encircling the features 200-202, respectively. The patterned material 190 may comprise photoresist, or may comprise any other suitable composition. The rings are separated from one another by spaces 214 and 216; and additional spaces 213 and 217 are along illustrated outside edges of rings 210 and 212, respectively.

In some embodiments the photoresist 190 may be considered to be a first patterned mask comprising a plurality of spaced apart first features 200-202. The first features are linear in the shown embodiment, with the features being rectangular lines in the shown view. The features 200-202 are parallel to one another, and are spaced from one another by a distance 191. The features 200-202 are on a first pitch 195.

The rings 210-212 may be considered to be formed around lateral peripheries of the first features. Since the first features can remain within the rings during a subsequent patterning step, the first features and rings may be together considered to form second masking features 200/210, 201/211 and 202/212 in the shown embodiment. Such second masking features may be considered to be spaced-apart second linear features, which are separated from one another by a distance 193 which is less than the distance 191. The distance 193 will ultimately define widths of a plurality of openings, as discussed below.

In the shown embodiment the spacers 30, features 200-202, and spaces 214 and 216, all have the same width "X." In other embodiments, the widths of one or more of spaces 213-217 may be tailored to other dimensions. For example, the widths of spaces 213-217 may be tailored by modifying the thickness of spacer material 28. Thicker spacer material will lead to smaller spaces, and thinner spacer material will lead to larger spaces.

Referring to FIG. 21, patterned masking material 220 is formed over features 200-202 and rings 210-212. The masking material has a trench 222 extending therethrough, with such trench exposing segments of the features 200-202 and rings 210-212. The masking material 220 comprises a composition which can be selectively removed relative to the material 28 of the rings, and the material 190 of the features 200-202. In some embodiments masking material 220 comprises, consists essentially of, or consists of photoresist.

The trench 222, together with the rings 210-212 and features 200-202, defines a plurality of openings 230-234; with each opening being in a location of one of the spaces 213-217 (FIG. 20). Since the openings are in locations of the spaces 213-217, and the widths of such spaces may be tailored with the thickness of spacer material 28; the widths of openings 213-217 may also be tailored with the thickness of spacer material 28.

Referring to FIG. 22, openings 230-234 are transferred into underlying material 18, and the features 200-202 and rings 210-212 (FIG. 21) are removed from over material 18. The openings are on a pitch 197 that is the same as the pitch 195 that the features 200-202 were on (FIG. 20) in the shown embodiment, but are offset from the edges of the features 200-202 by the widths of the rings 210-212. It may be useful to have such offset of the openings relative to the original location of the first masking features 200-202 in applications in which it is desired to line up the openings with underlying components that would also be offset relative to the masking features.

FIGS. 23-25 show another example embodiment process.

Referring to FIG. 23, a semiconductor construction 300 is shown to comprise a plurality of spaced-apart features 302 of patterned masking material 304; and to comprise gaps 306 between the spaced-apart features. The features 302 may correspond to portions of rings (such as the rings 32-35 of FIG. 9) in some embodiments. The gaps 306 extend through the masking material to expose an upper surface of a substrate 308. The substrate may comprise any of numerous structures; and in some embodiments may comprise lines analogous to the lines 1-8 described above, and may comprise various materials analogous to the materials 14, 16 and 18 described above. The patterned features 302 may be considered to correspond to a first patterned mask 305 formed over the substrate 302.

Referring to FIG. 24, a patterned masking material 310 is formed over the patterned features 302. The patterned masking material 310 may be considered to correspond to a second patterned mask 307. The second patterned mask has a pair of spaced-apart windows 312 and 314 extending therethrough (regions of features 302 of the first mask that are outside of the windows are illustrated with dashes to indicate that they are beneath masking material 310). The first and second patterned masks 305 and 307 together define a plurality of openings 350-357 extending to substrate 308. It is noted that openings 353 and 354 are formed from the same gap in the first mask 305 (FIG. 23), but from different windows in the second mask 307.

Referring to FIG. 25, the openings 350-357 are extended into the substrate with one or more suitable etches, and the first and second patterned masks 305 and 307 (FIG. 24) are removed. In some embodiments the openings 350-357 can be contact openings, with each of said openings extending to a separate electrically conductive structure within substrate 308.

The embodiments discussed above may be utilized in forming components which may be incorporated into electronic systems. Example electronic systems are computers, cars, airplanes, clocks, cellular phones, etc. Example components which may be formed with the processing described herein are memory structures, such as, for example, flash memory structures.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When an element is referred to as being "on" or "against" another element, it can be directly on the other element or intervening elements may also be present. In contrast, when an element is referred to as being "directly on," or "directly against" another element, there are no intervening elements present. When an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of patterning a material, comprising:
   forming a first patterned mask over the material, the first patterned mask comprising a plurality of spaced-apart first features, the spaced-apart first features having lateral peripheries; the first features being parallel to one another and being spaced from one another by a first distance;
   forming spacers around the lateral peripheries of the spaced apart first features; the spacers and first features together forming spaced apart second features of a second patterned mask; the second features being spaced from one another by a second distance which is less than the first distance;
   forming a third patterned mask over the second patterned mask; the third patterned mask having a trench extending therethrough to exposed segments of the second features; the second and third patterned masks together defining a plurality of openings; and
   transferring the openings into the material.

2. The method of claim 1 wherein the spacers comprise silicon dioxide; and wherein one of the first and second patterned masks comprises photoresist.

3. The method of claim 1 wherein the material is an oxide-containing material.

4. The method of claim 1 wherein the material is a carbon-containing material.

5. The method of claim 1 wherein the transferring of the openings into the material forms contact openings that extend through the material to upper surfaces of electrically conductive lines.

6. A method of patterning materials, comprising:
   forming a first patterned mask over the materials, the first patterned mask comprising a plurality of spaced-apart first features, the spaced-apart first features having lateral peripheries; the first features being parallel to one another and being spaced from one another by a first distance;
   forming spacers around the lateral peripheries of the spaced apart first features; the spacers and first features together forming spaced apart second features of a second patterned mask; the second features being spaced from one another by a second distance which is less than the first distance;
   forming a third patterned mask over the second patterned mask; the third patterned mask having a trench extending therethrough to exposed segments of the second features; the second and third patterned masks together defining a plurality of openings; and
   transferring the openings into the materials; wherein the materials comprise oxide-containing material over carbon-containing material.

7. The method of claim 6 wherein the spacers comprise silicon dioxide; and wherein one of the first and second patterned masks comprises photoresist.

\* \* \* \* \*